(12) United States Patent
Kanno

(10) Patent No.: US 8,171,440 B2
(45) Date of Patent: May 1, 2012

(54) TIMING ANALYZING APPARATUS, TIMING ANALYZING METHOD AND PROGRAM THEREOF

(75) Inventor: Koji Kanno, Tokyo (JP)

(73) Assignee: NEC Corporation, Tokyo (JP)

( * ) Notice: Subject to any disclaimer, the term of this patent is extended or adjusted under 35 U.S.C. 154(b) by 359 days.

(21) Appl. No.: 12/537,133

(22) Filed: Aug. 6, 2009

(65) Prior Publication Data

US 2010/0050141 A1 Feb. 25, 2010

(30) Foreign Application Priority Data

Aug. 20, 2008 (JP) ................................ 2008-211549

(51) Int. Cl.
*G06F 17/50* (2006.01)
(52) U.S. Cl. ........... 716/108; 716/113; 716/134; 703/16
(58) Field of Classification Search .................. 716/108, 716/113, 134; 703/16
See application file for complete search history.

(56) References Cited

U.S. PATENT DOCUMENTS

| | | | | |
|---|---|---|---|---|
| 5,452,239 A * | 9/1995 | Dai et al. | ......................... | 703/19 |
| 5,475,830 A * | 12/1995 | Chen et al. | ..................... | 716/108 |
| 5,659,484 A * | 8/1997 | Bennett et al. | ................ | 716/113 |
| 5,774,371 A * | 6/1998 | Kawakami | .................... | 716/113 |
| 6,086,621 A * | 7/2000 | Ginetti et al. | ................... | 716/113 |
| 6,223,329 B1 * | 4/2001 | Ling et al. | ...................... | 716/129 |
| 6,301,553 B1 * | 10/2001 | Burgun et al. | ................. | 703/15 |
| 7,240,315 B1 * | 7/2007 | Wang et al. | ................... | 716/113 |
| 7,406,669 B2 * | 7/2008 | Lindberg | ....................... | 716/108 |
| 7,480,881 B2 * | 1/2009 | Tetelbaum et al. | ........... | 716/113 |
| 7,509,598 B1 * | 3/2009 | Shen et al. | ..................... | 716/126 |
| 7,546,567 B2 * | 6/2009 | Cheon et al. | ................... | 716/113 |
| 7,676,768 B1 * | 3/2010 | Bourgeault et al. | ........... | 716/126 |
| 7,765,503 B2 * | 7/2010 | Smith | .......................... | 716/113 |
| 7,926,019 B1 * | 4/2011 | Ravi | .............................. | 716/134 |
| 7,941,774 B2 * | 5/2011 | Luan et al. | ..................... | 716/113 |
| 2003/0110462 A1 * | 6/2003 | Cohn et al. | ......................... | 716/6 |
| 2005/0251775 A1 * | 11/2005 | Wood | .............................. | 716/10 |
| 2006/0080632 A1 * | 4/2006 | Ng et al. | ......................... | 716/17 |
| 2007/0130486 A1 * | 6/2007 | Lindberg | ..................... | 713/503 |
| 2008/0046848 A1 * | 2/2008 | Tetelbaum et al. | ............... | 716/6 |

(Continued)

FOREIGN PATENT DOCUMENTS

JP 4-211872 A 8/1992

(Continued)

OTHER PUBLICATIONS

Japanese Office Action for JP2008-211549 issued Jun. 15, 2010.

*Primary Examiner* — Phallaka Kik

(57) ABSTRACT

A timing analyzing apparatus according to an exemplary aspect of the invention includes, a storage apparatus which stores a global clock list including information on clock paths inside and outside a partial area of an electronic circuit, and a post layout processing area netlist which is a netlist of the partial area after layout processing of circuits therein is executed; and a timing analyzing unit which calculates the clock skew between two points on the circuits in the partial area, neglecting the clock delay of a common part outside thereof of two clock paths from the clock source, located outside thereof in the electronic circuit, to the two points (CRPR calculation), to judge whether the delay of a clock path and a signal path of the electronic circuit satisfies timing constraints using the calculated clock skew.

16 Claims, 22 Drawing Sheets

U.S. PATENT DOCUMENTS

| | | | |
|---|---|---|---|
| 2008/0168412 A1* | 7/2008 | Cheon et al. | 716/7 |
| 2009/0222780 A1* | 9/2009 | Smith | 716/6 |
| 2010/0031214 A1* | 2/2010 | Hou et al. | 716/9 |

FOREIGN PATENT DOCUMENTS

| | | |
|---|---|---|
| JP | 2000100948 A | 4/2000 |
| JP | 2000172738 A | 6/2000 |
| JP | 2000223578 A | 8/2000 |
| JP | 2000242675 A | 9/2000 |
| JP | 2000243846 A | 9/2000 |
| JP | 2000250950 A | 9/2000 |
| JP | 2000259686 A | 9/2000 |
| JP | 2000305966 A | 11/2000 |
| JP | 2001273338 A | 10/2001 |
| JP | 2003337844 A | 11/2003 |
| JP | 2005235804 A | 9/2005 |
| JP | 2005284826 A | 10/2005 |
| JP | 2006039621 A | 2/2006 |
| JP | 2007034668 A | 2/2007 |
| JP | 2007188517 A | 7/2007 |
| JP | 2007257293 A | 10/2007 |
| JP | 2008009787 A | 1/2008 |

* cited by examiner

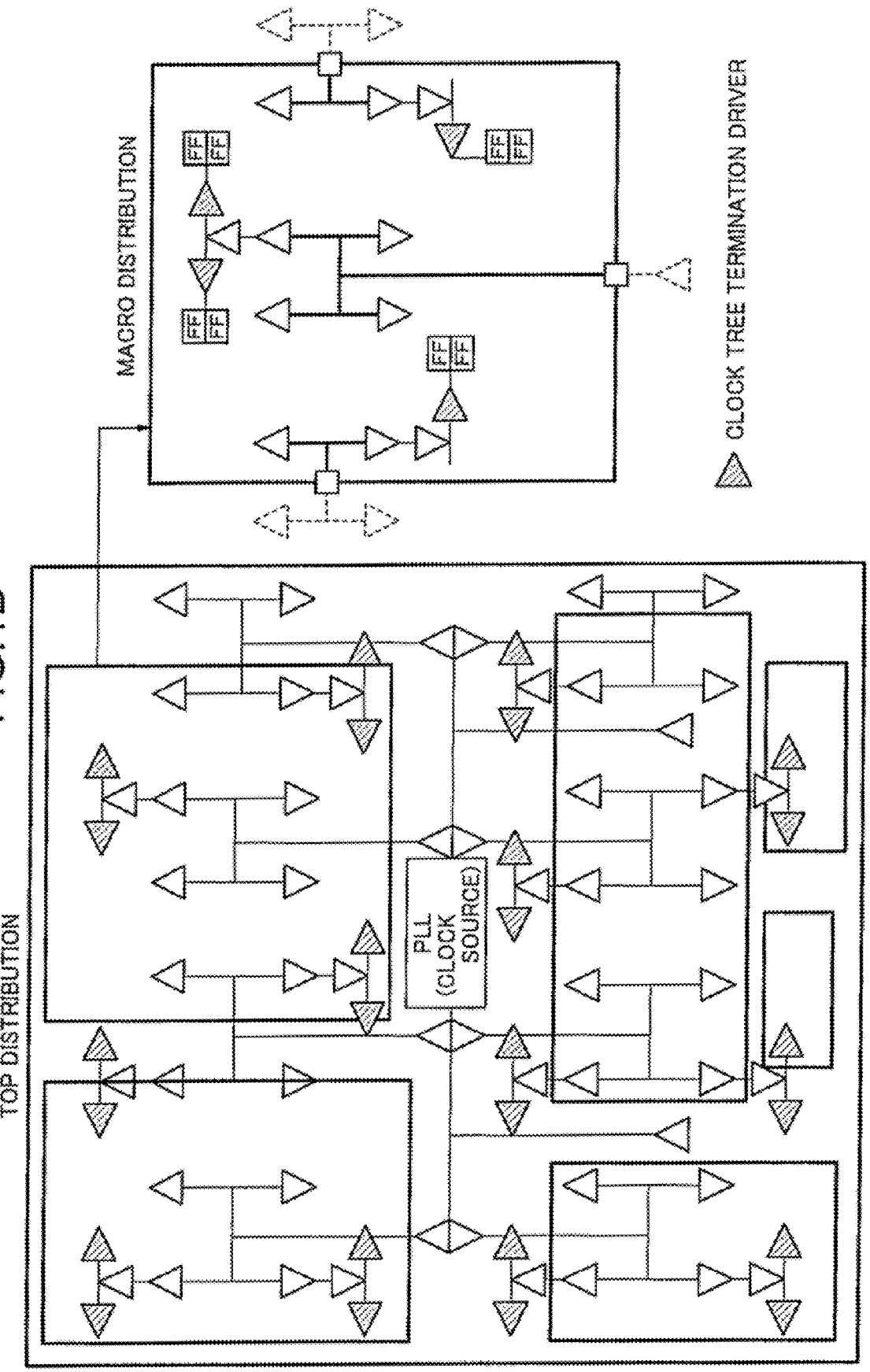

FIG.9
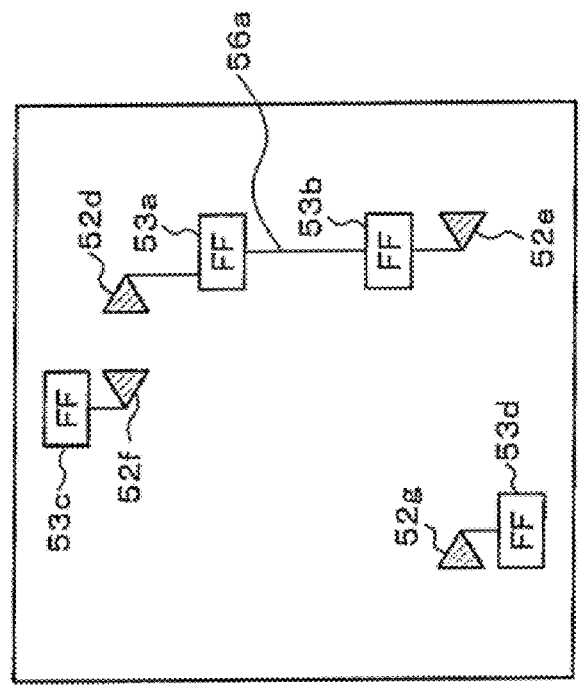
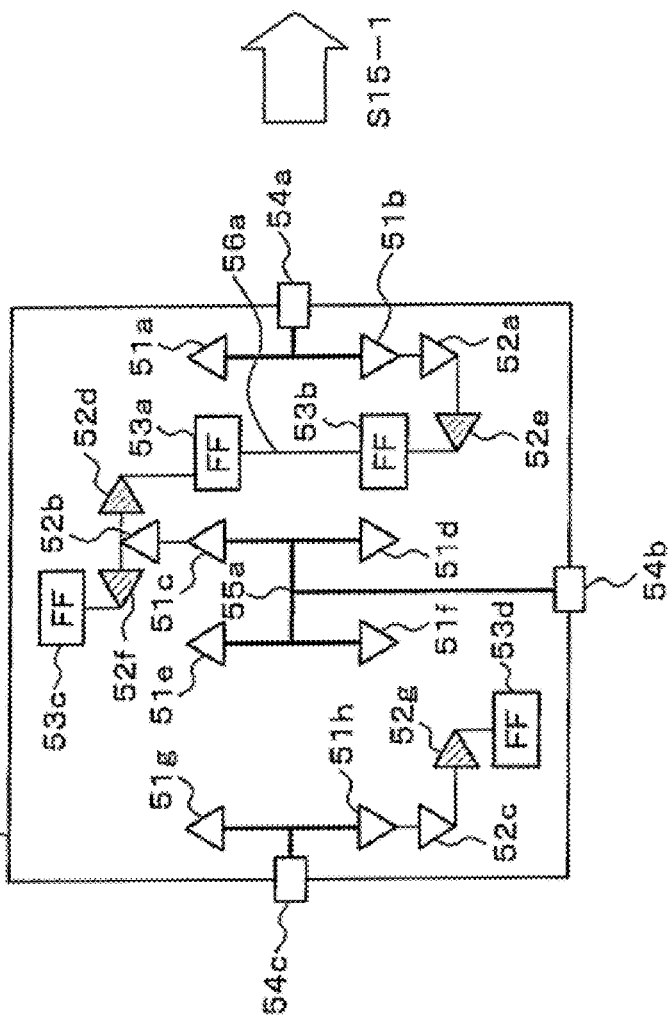

FIG.18

| STARTING POINT \ TERMINATING POINT | 54a | 54b | 54c |
|---|---|---|---|
| 54a | | 120 | 80 |
| 54b | −60 | | −20 |
| 54c | 80 | 160 | |

1g CLOCK SKEW TABLE OF MACRO b

TIMING ANALYZING APPARATUS, TIMING ANALYZING METHOD AND PROGRAM THEREOF

This application is based upon and claims the benefit of priority from Japanese patent application No. 2008-211549, filed on Aug. 20, 2008, the disclosure of which is incorporated herein in its entirety by reference.

TECHNICAL FILED

The present invention relates to a timing analyzing apparatus, a timing analyzing method and a program thereof and in particular, relates to a timing analyzing apparatus, a timing analyzing method and a program thereof, which carry out timing analysis on the basis of CRPR.

BACKGROUND ART

The CRPR (Clock Reconvergence Pessimism Removal) method, which removes pessimistic conditions based on common points of clock paths, has been prevailing in circuit designs. For example, since the delay time does not vary at a common point which is the cross point of clock paths, the delay analysis, in which delays are calculated excluding or neglecting delays at common points, can prevent excessive design margins.

For example, Japanese Patent Application Laid-Open No. 2007-188517 (paragraph 0213) discloses a clock distributing apparatus which, through going back along a path in the direction opposite to a signal propagation direction on the basis of a net list and extracting a non-common part on finding out a common part, carries out automatically calculation with no variation of delay of a common part.

SUMMARY

In recent years, as a circuit like an LSI (Large Scale Integration) becomes larger than ever, it becomes prevailing that an LSI is designed in a unit of macro, or that processing of cutting out an arbitrary area of a chip and processing for the area are carried out after chip layout processing has been completed. The clock distributing apparatus mentioned above has a problem that circuit designs with no excessive design margin is impossible, since timing analysis on clock paths inside and outside an arbitrary area (for example, inside and outside macro), is not carried out on the basis of CRPR.

An exemplary object of the present invention is to provide a timing analyzing apparatus, a timing analyzing method and a program thereof to solve the problem mentioned above.

A timing analyzing apparatus according to an exemplary aspect of the invention includes, a storage apparatus which stores a global clock list including information on clock paths inside and outside a partial area of an electronic circuit, and a post layout processing area netlist which is a netlist of the partial area after layout processing of circuits therein is executed; and a timing analyzing unit which calculates the clock skew between two points on the circuits in the partial area, neglecting the clock delay of a common part outside thereof of two clock paths from the clock source, located outside thereof in the electronic circuit, to the two points (CRPR calculation between the two points), to judge whether the delay of a clock path and a signal path of the electronic circuit satisfies timing constraints using the calculated clock skew.

A timing analyzing method according to an exemplary aspect of the invention includes, storing a global clock list including information on clock paths inside and outside a partial area of an electronic circuit, and a post layout processing area netlist which is a netlist of the partial area after layout processing of circuits therein is executed; and calculating the clock skew between two points on the circuits in the partial area, neglecting the clock delay of a common part outside thereof of two clock paths from the clock source, located outside thereof in the electronic circuit, to the two points (CRPR calculation between the two points), to judge whether the delay of a clock path and a signal path of the electronic circuit satisfies timing constraints using the calculated clock skew.

A computer-readable recording medium according to an exemplary aspect of the invention records thereon a program which makes a computer function as a storage apparatus which stores a global clock list including information on clock paths inside and outside a partial area of an electronic circuit, and a post layout processing area netlist which is a netlist of the partial area after layout processing of circuits therein is executed; and a timing analyzing unit which calculates the clock skew between two points on the circuits in the partial area, neglecting the clock delay of a common part outside thereof of two clock paths from the clock source, located outside thereof in the electronic circuit, to the two points (CRPR calculation between the two points), to judge whether the delay of a clock path and a signal path of the electronic circuit satisfies timing constraints using the calculated clock skew.

BRIEF DESCRIPTION OF THE DRAWINGS

Exemplary features and advantages of the present invention will become apparent from the following detailed description when taken with the accompanying drawings in which:

FIG. 1-B shows LSI after the top distribution processing and macro distribution processing;

FIG. 9 shows removal of description on a clock path which extends to a clock tree terminating driver;

FIG. 18 shows a clock skew table of the macro b shown in FIG. 17;

EXEMPLARY EMBODIMENT OF THE PRESENT INVENTION

First, circumstance of the present invention will be described in the following, before description on an exemplary embodiment of the present invention will be made.

As a circuit like an LSI becomes larger than ever, it becomes prevailing that an LSI is designed in a unit of macro, or that processing of cutting out an arbitrary area of a chip and processing for the area is carried out after chip layout processing has been completed, as mentioned above.

Figure 1A:
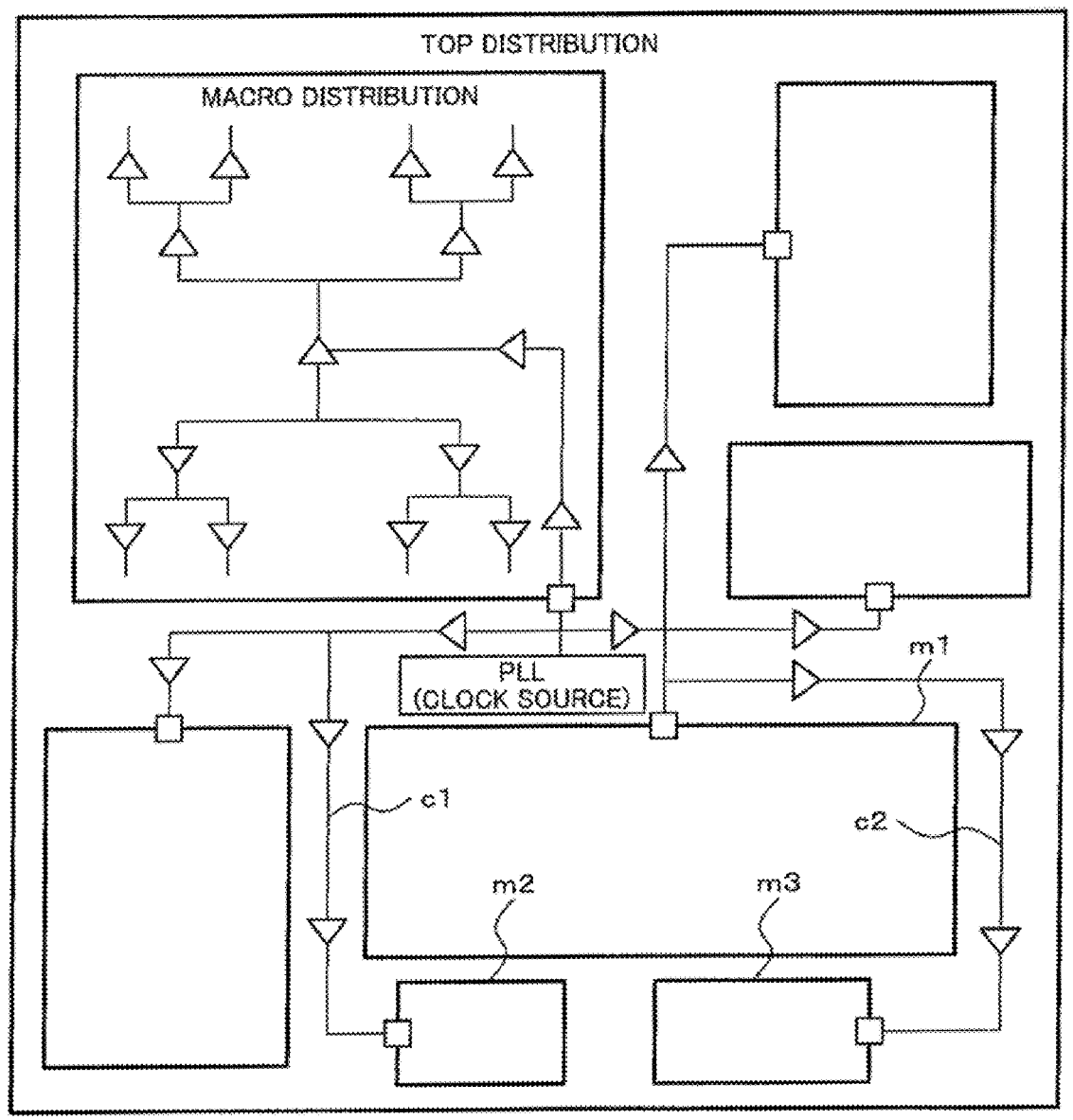
FIG. 1-A shows LSI after top distribution processing.

FIG. 1-A shows an LSI after top distribution processing. As a method for clock distribution in a hierarchical design, it is a popular method that a clock is distributed in layout processing of both top processing (processing which is carried out for a whole chip, handling macro as a black box) and macro processing (processing inside the macro), and clock distribution in the top processing and clock distribution in the macro processing are merged together in chip processing (processing for a whole chip), as shown in FIG. 1-A.

The clock distributing method above causes a problem that when a whole chip is synchronized, the number of stages becomes large and consequently, clock skew becomes large. As shown in FIG. 1-A, since clock paths c1 and c2 detour a macro m1 and then, are distributed to macros m2 and m3, the clock paths c1 and c2 include many stages due to the detour and as a result, the clock skew regarding the clock paths c1 and c2 increases.

As a clock distributing method to solve the problem, the present invention adopts a method which is shown in FIG. 1-B. FIG. 1-B shows an LSI after the top distribution processing and the macro distribution processing. According to the method, the clock distribution is carried out for the whole of the chip at a time of the top processing and clock paths, which exist inside a macro, are cut out from the clock paths distributed on the whole of the chip in the macro processing and then, the macro processing is carried out for the cut-out clock paths. Moreover, according to the method, the clock distribution in the macro processing is connecting clock tree terminating drivers with FFs (Flip-Flop) in the macro.

According to the method, it may be possible to make numbers of stages small in comparison with the method mentioned above and to make clock skew small. However, in case that a macro is cut out without considering physical positions of the clock distribution, the macro tends to include fragmentary clock paths with a plurality of clock pins at the boundary of the macro, since the macro is cut out in a state that clock paths are distributed on the whole of the chip and a macro processing is carried out for the cut-out macro.

Moreover, numbers of stages of the clock tree from a clock source (PLL (Phase Locked Loop) circuit) on the LSI chip to clock pins located at the boundary of the macro may be varied from pin to pin. For this reason, it is difficult to use clock skew with high accuracy in the timing analysis on the macro. It may be possible to use delays of clock paths from the PLL circuit to the boundary of the macro, which is obtained in the top processing, in the macro timing analysis, if a timing analyzing tool is used properly. However, it is impossible for the timing analyzing tool to recognize connection relations between clock paths outside the macro, if delays of clock paths, which are from the PLL circuit to the boundary of the macro, are merely applied to the macro timing analysis. Therefore, it is impossible for the timing analyzing tool to recognize a common point of clock paths outside the macro, and to apply CRPR.

Figure 2:
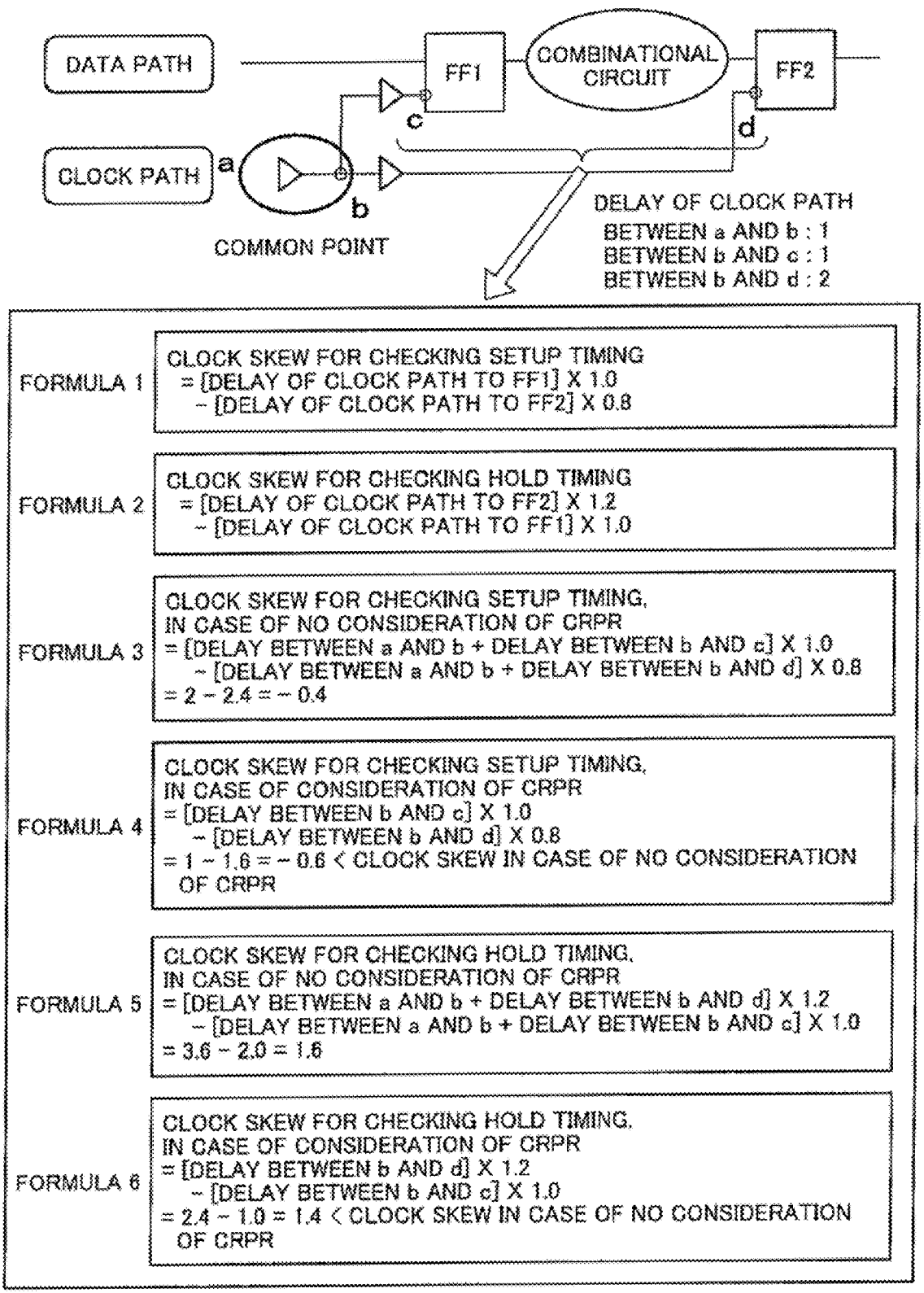
FIG. 2 shows comparison between clock skew in a case of considering CRPR and clock skew in a case of no considering CRPR in processing for calculating clock skew.

Here, CRPR will be described in the following. FIG. 2 shows comparison between clock skew in a case of considering CRPR and clock skew in a case of no considering CRPR in calculating clock skew.

In the delay analysis in consideration of variation in characteristics of transistors and wiring, as shown in a formula 1 and a formula 2 of FIG. 2, a margin is given to clock skew, through multiplying a different coefficient and each delay of starting FF and terminating FF. However, a semiconductor integrated circuit has no variation in characteristics of the transistors and the wiring in the common point (between a and b in the figure) which is a cross point of clock paths shown in FIG. 2. Therefore, the method in which a coefficient is multiplied by a clock path delay has a tendency to adopt excessive clock skew and consequently, to carry out pessimistic delay analysis. CRPR removes the pessimistic condition in consideration of the common point of the clock path.

Formulas 3 to 6 show a specific example of calculation respectively. According to the examples of calculation, it is assumed that clock path delay between a and b is 1, and one between b and c is 1, and one between b and d is 2. As shown in the formulas 3 to 6, difference between clock skew in a case of considering CRPR and clock skew in a case of not considering CRPR is due to multiplying a coefficient by the delay of the common point which is between a and b. Because of the difference according to the examples of calculation, clock skew for SETUP time check and clock skew for HOLD time check in a case of considering CRPR are smaller by 0.2 than ones in a case of not considering CRPR respectively. This means that in a case of considering CRPR, it is possible to reduce clock skew by 0.2 which is the excessive design margin in a case of not considering CRPR.

In case that the timing analyzing tool can not recognize the connection relation between clock paths outside the macro, the timing analyzing tool can not apply CRPR in the timing analysis on the macro, and consequently, has to carry out the timing analysis, based on the excessively large clock skew. This is a cause which disturbs the most suitable macro design. Timing analysis on an arbitrary area after the chip layout processing has a similar problem.

Figure 3:
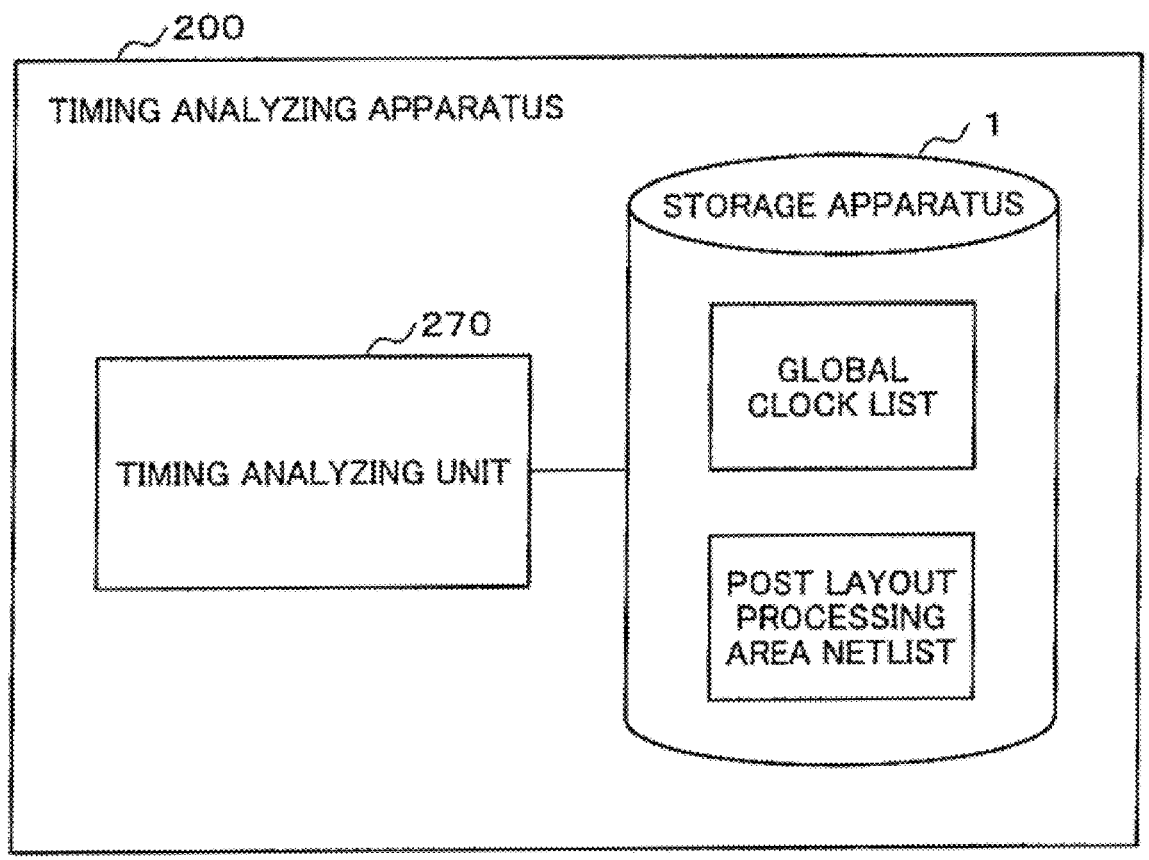
FIG. 3 shows an outline of a timing analyzing apparatus according to the present invention.

Next, an outline of an exemplary embodiment of the present invention will be described. FIG. 3 shows the outline of a timing analyzing apparatus according to the exemplary embodiment.

According to the figure, a timing analyzing apparatus 200 includes a timing analyzing unit 270 and a storage apparatus 1. The storage apparatus 1 stores a global clock list including information on the clock paths inside and outside a partial area such as an arbitrary area of an electronic circuit such as LSI, and a post layout processing area netlist which is a netlist after circuit layout processing for the partial area is executed. The timing analyzing unit 270 is supplied with the global clock list and the post layout processing area netlist and carries out the timing analysis on clock paths inside and outside the partial area, based on CRPR. As a result, the exemplary embodiment has an effect that it is possible to design a circuit with no excessive design margin.

Now, the first exemplary embodiment of the present invention will be described in detail with reference to drawings. According to the first exemplary embodiment, a timing analyzing unit recognizes a common point, which is a cross point of clock paths, on the basis of an outside macro clock path including macro netlist 16, which includes clock paths inside and outside the macro, and carries out the timing analysis. A clock distributing method [H-Tree] used in the following description is an example and the present invention is not limited to this method.

Figure 4:
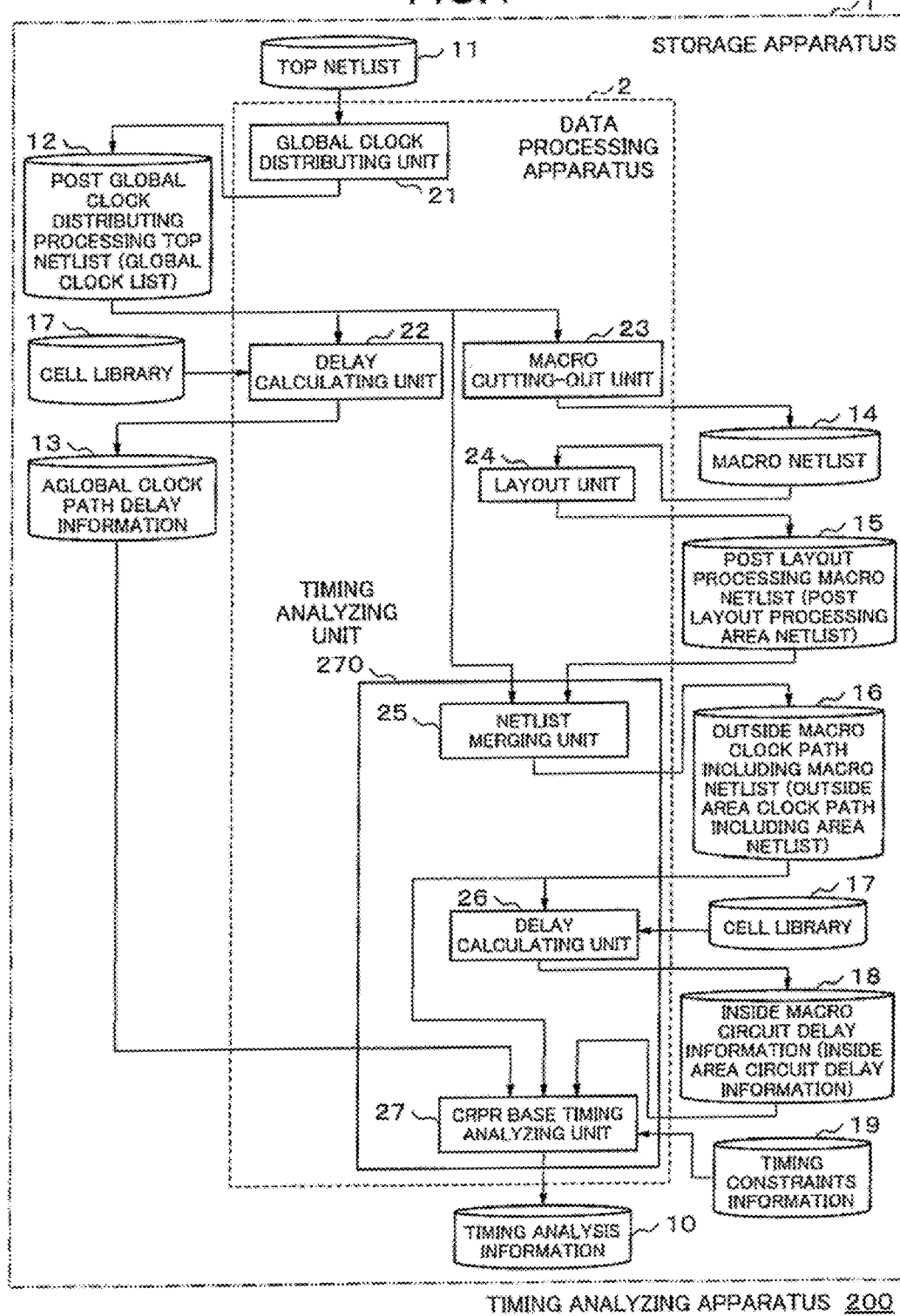
FIG. 4 shows a timing analyzing apparatus according to a first exemplary embodiment of the present invention.

FIG. 4 shows a timing analyzing apparatus according to the first exemplary embodiment of the present invention.

The timing analyzing apparatus 200 includes a data processing apparatus 2 which operates with program control, and a storage apparatus 1 such as a hard disk. While FIG. 4 indicates that the data processing apparatus 2 is installed inside the storage apparatus 1 for convenience of explanation, it may be preferable that the data processing apparatus 2 and the storage apparatus 1 are different apparatus each other and are connected each other.

The storage apparatus 1 stores a top netlist 11, a cell library 17 and timing constraints information 19. Moreover, the storage apparatus 1 stores a post global clock distributing processing netlist 12, global clock path delay information 13, a macro netlist 14, a post layout processing macro netlist 15, an outside macro clock path including macro netlist 16, inside macro circuit delay information 18, and timing analysis information 10, as output information.

The top netlist 11 is outputted from a layout tool, after both of macro layout processing (floor planning) and primitive cell layout processing have been completed on the assumption that the macro is in low order in the hierarchy. The storage apparatus 1 stores the top netlist 11 in advance.

The cell library 17 stores information on delays from input pins to output pins of cells such as FFs and clock drivers, and information on setup time or hold time of clock signals for data signals which are supplied to input pins, in advance. The cell library is described in detail as a cell library and a timing constraints library in Japanese Patent Application Laid-Open No. 2001-273338 and Japanese Patent Application Laid-Open No. 2006-39621 respectively.

The timing constraints information 19 includes information on a basic clock period (or basic clock frequency), delays caused outside input pins, required delays outside the output pins, delay constraints exception paths (false paths and multiple cycle paths) or the like. The storage apparatus 1 stores the timing constraints information 19 in advance.

The post global clock distributing processing top netlist 12 is a netlist which indicates the clock paths distributed on the whole of the chip (left side of FIG. 1-B).

The global clock path delay information 13 includes information on wiring delays and gate delays of each network of the global clock paths.

The macro netlist 14 is a netlist which indicates circuits such as the clock paths inside the macro cut out from the post global clock distributing processing netlist 12, and is outputted from, for example, a macro cutting-out unit 23.

The post layout processing macro netlist 15 is a netlist which indicates a state after carrying out the inside macro circuit layout processing for the macro netlist 14, and is outputted from a layout unit 24.

The outside macro clock path including macro netlist 16 is a netlist created by merging, after cutting out description on clock paths related to a macro (for example, clock paths for supplying clock signals to the macro) from the post global clock distributing processing top netlist 12, the post layout processing macro netlist 15 with the cut-out description on clock paths. The outside macro clock path including macro netlist 16 is outputted from a netlist merging unit 25.

The inside macro circuit delay information 18 is information on wiring delays and gate delays, which are calculated by a delay calculating unit 26, of each network inside the macro.

The timing analysis information 10 includes timing constraints violating paths and frequency distribution statistic information on each violation value, which are found out through checking whether each delay constraint is satisfied. The checking is conducted by a CRPR base timing analyzing unit 27.

The data processing apparatus 2 includes the global clock distributing unit 21, the delay calculating unit 22, the macro cutting-out unit 23, the layout unit 24, the netlist merging unit 25, the delay calculating unit 26 and the CRPR base timing analyzing unit 27. According to the exemplary embodiment, the netlist merging unit 25, the delay calculating unit 26 and the CRPR base timing analyzing unit 27 and the like compose the timing analyzing unit 270.

The global clock distributing unit 21 outputs the post global clock distributing processing top netlist 12 which indicates the clock paths distributed on the whole of the chip on the basis of the top netlist 11. In the global clock distributing processing, the global clock distributing unit 21 takes it into consideration that shield wirings and adjacent distribution prohibiting wirings are formed so that delays of clock paths may not change seriously in the following layout processing.

The delay calculating unit 22 carries out calculation of delays on the basis of the post global clock distribution processing netlist 12 with the RC (Resistance Capacitance) simulation method with reference to the cell library 17, and outputs the global clock path delay information 13. The delay calculating unit 22 may be called a global clock path delay calculating unit.

The macro cutting-out unit 23 outputs the macro netlist 14 which indicates circuits such as the clock paths inside the macro cut out from the post global clock distributing processing netlist 12.

The layout unit 24 carries out the layout processing which includes connecting clock tree terminating drivers, which are at termination points of the global clock distribution, with FFs inside the macro, and then, outputs the post layout processing macro netlist 15.

The netlist merging unit 25 cuts out description on the clock path, which is related to the macro, from the post global clock distributing processing top netlist 12, based on the post global clock distributing processing top netlist 12 and the post layout processing macro netlist 15, and merges the cut-out description on the clock path with the post layout processing macro netlist 15, and outputs the merging result as the outside macro clock path including macro netlist 16.

The delay calculating unit 26 carries out calculation of delay on the basis of the outside macro clock path including macro netlist 16 with the RC simulation method with reference to the cell library 17, and outputs the calculated delay as the inside macro circuit delay information 18.

The CRPR base timing analyzing unit 27 refers to the outside macro clock path including macro netlist 16, the global clock path delay information 13, the inside macro circuit delay information 18 and the timing constraints information 19. The CRPR base timing analyzing unit 27 annotates the global clock path delay information to the clock paths outside the macro and annotates delay information out of the inside macro circuit delay information to the circuits inside the macro. Then, the CRPR base timing analyzing unit 27 calculates delays of the signal paths, delays of the clock paths, and clock skew, based on these delay information, and checks whether delays of the clock paths and delays of the signal paths satisfy the timing constraints, and outputs these calculation results or the like as the timing analysis information 10.

In case of calculating the clock skew, the CRPR base timing analyzing unit 27 obtains information on the common point which is a cross point of clock paths each of which extends from a starting point to a terminating point thereof, and then, calculates clock skew, based on CRPR (excluding or neglecting the delay caused in the common point). In case of checking whether delays of the clock paths and delay of the signal paths satisfy the timing constraints respectively, the CRPR base timing analyzing unit 27 checks specifically whether delays of the clock paths or delay of the signal paths satisfy the timing constraints by use of the clock skew based on CRPR.

Next, an operation of the first exemplary embodiment of the present invention will be described with reference to drawings.

Figure 5:
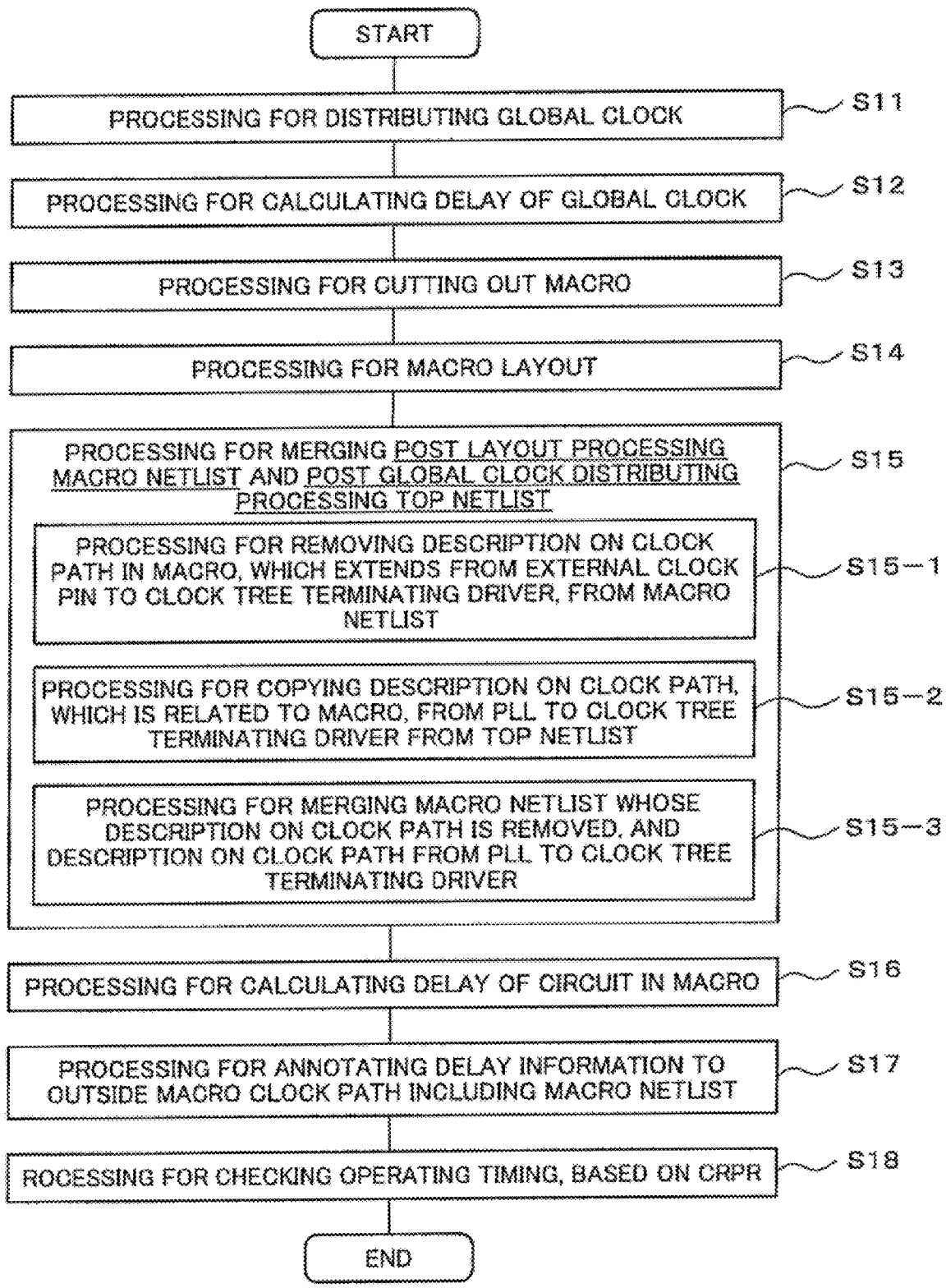
FIG. 5 is a flowchart showing timing analysis on a macro, based on CRPR.

FIG. 5 is a flowchart showing the timing analysis on the macro, based on CRPR.

Figure 6:
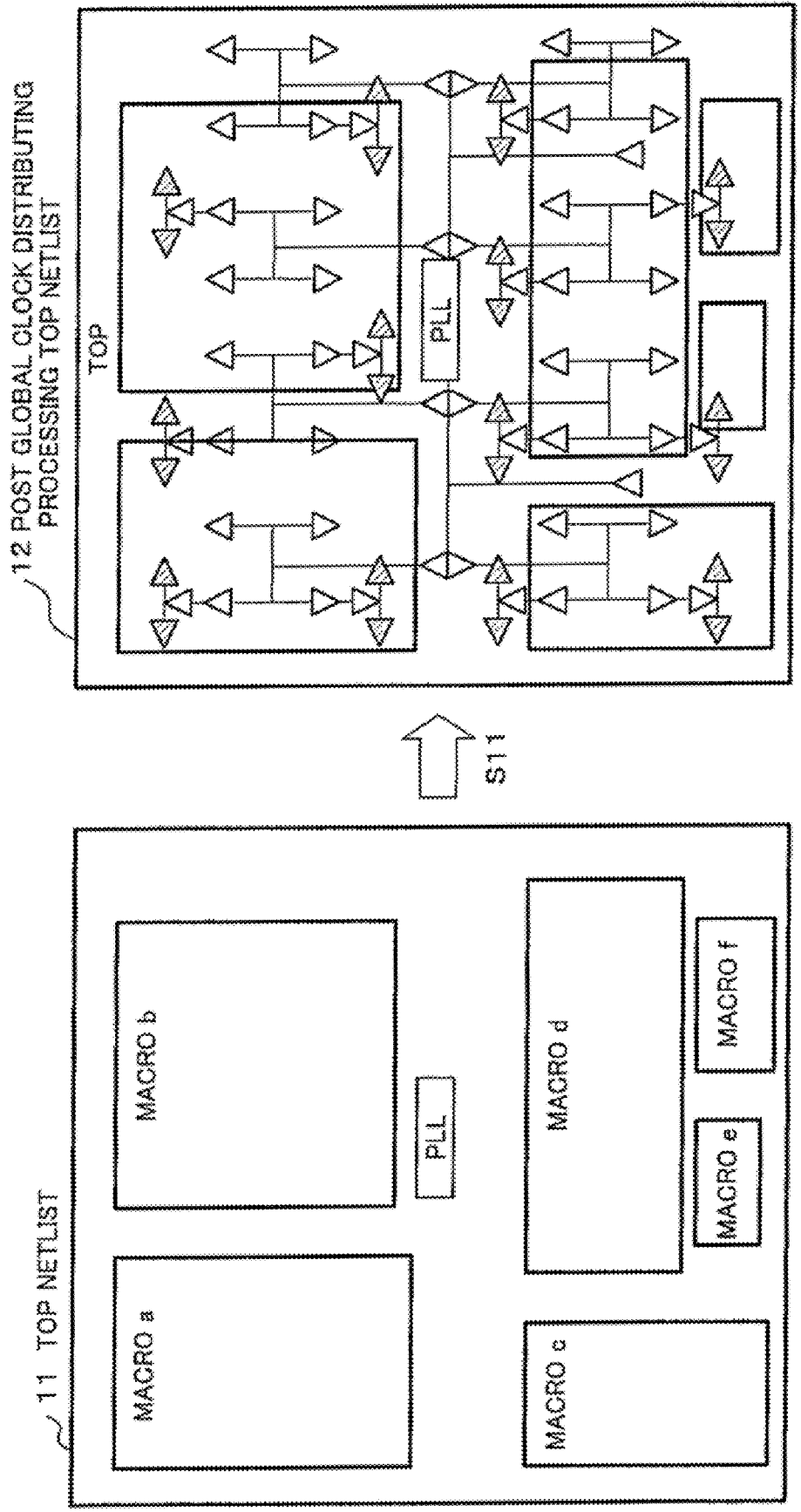
FIG. 6 shows global clock distributing processing of Step S11.

Step S11: The top netlist 11 is supplied to the global clock distributing unit 21. FIG. 6 shows global clock distributing processing of Step S11. The global clock distributing unit 21 carries out clock distribution on the whole of the chip including inside area of the macro, while clock distribution is usually carried out only to the boundary of the macro, and outputs the post global clock distributing processing top netlist 12.

Step S12: The post global clock distributing processing top netlist 12 is supplied to the delay calculating unit 22. The delay calculating unit 22 calculates delays, based on the RC simulation with reference to the cell library 17, and outputs the global clock path delay information 13. Details of Step S2 including the delay calculating unit 22 is referable to Japanese Patent Application Laid-Open No. 2001-273338, Japanese Patent Application Laid-Open No. 2000-259686, Japanese Patent Application Laid-Open No. 2000-305966, Japanese Patent Application Laid-Open No. 2000-250950 or the like.

Figure 7:
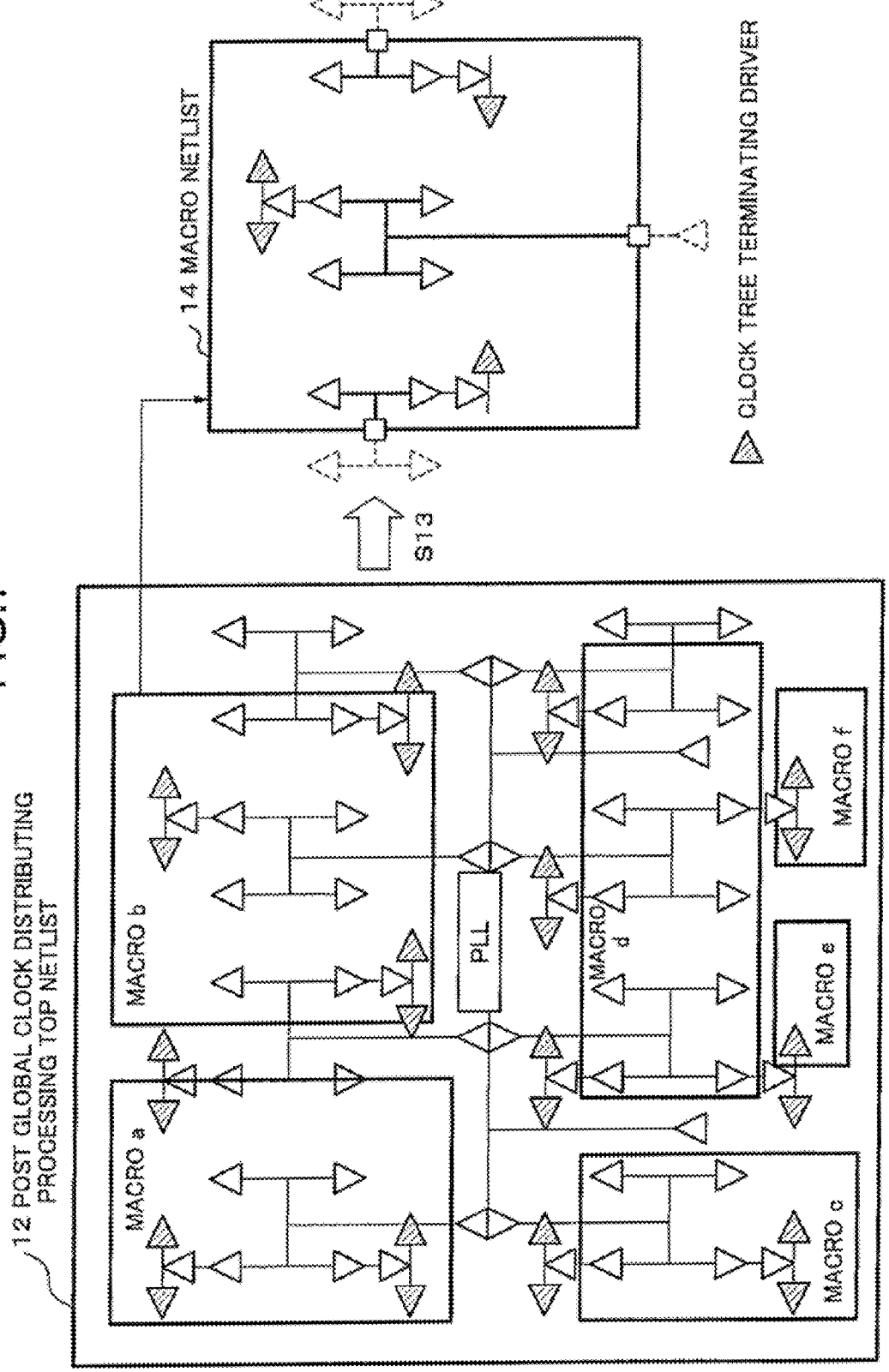
FIG. 7 shows macro cutting-out processing of Step S13.

Step S13: The post global clock distributing processing top netlist 12 is supplied to the macro cutting-out unit 23. FIG. 7 shows macro cutting-cut processing of Step S13. The macro cutting-out unit 23 cuts out circuits including the clock paths inside the macro, and outputs the cut-out circuit as the macro netlist 14. Clock distribution on the whole of the chip is carried out in Step S11, and the clock path is distributed physically. The macro cutting-out unit 23 makes an external clock pin of the macro at each cross point of the clock paths with the boundary of the macro, and cuts out the macro which includes the external clock pins thereof. Processing, except the processing for cutting out the clock pins, is referable to Japanese Patent Application Laid-Open No. 2008-9787, Japanese Patent Application Laid-Open No. 2005-235804 or the like.

Step S14: The macro netlist 14 is supplied to the layout unit 24, and the layout unit 24 carries out the layout processing for the circuits inside the macro, and outputs the post layout processing macro netlist 15. The layout unit 24 carries out processing for making clock paths, each of which is from a clock tree terminating driver to a clock inputting pin of each FF in the macro, in the layout processing. As a result, clock from the clock source is distributed completely to FFs in this processing. The processing for making the clock paths is referable to Japanese Patent Application Laid-Open No. 2000-243846 or the like. Details of other layout processing are referable to Japanese Patent Application Laid-Open No. 2000-223578, Japanese Patent Application Laid-Open No. 2000-172738, Japanese Patent Application Laid-Open No. 2000-100948 or the like.

Step S15: The post layout processing macro netlist 15 and the post global clock distributing processing top netlist 12 are supplied to the netlist merging unit 25, and the netlist merging unit 25 carries out netlist merging processing. Step S15, which is divided into steps S15-1 to S15-3, will be described in detail in the following with reference to FIGS. 8 to 11, and based on these divided steps.

Figure 8:
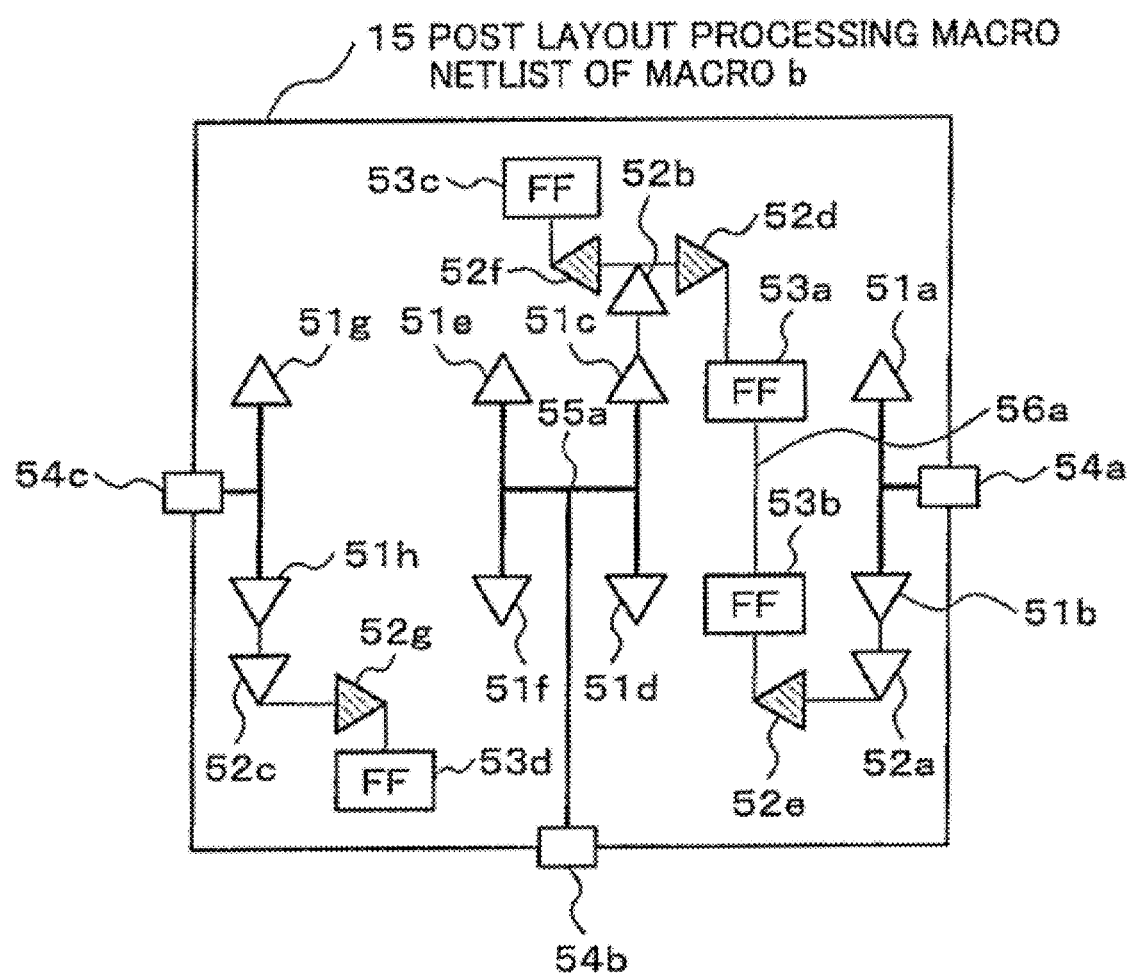
FIG. 8 shows a post layout macro netlist of a macro b which is an object of timing analysis.

FIG. 8 shows the post layout processing macro netlist of a macro b which is an object of the timing analysis. The macro b includes cells 51a to 51h, 52a to 52g and 53a to 53d, external input pins 54a to 54c, a clock wiring branch point 55a and a general Signal wiring 56a, as shown in FIG. 8. Cells 51a to 51h are global clock drivers. Cells 52a to 52j are local clock drivers. Cells 53a to 53d are flip-flops (FFs). The macro b is a circuit in which these elements are combined as shown in FIG. 8.

Step S15-1: The netlist merging unit 25 removes description on the clock paths (cells, nets and input pins), which extend to the clock tree termination drivers, from the post layout processing macro netlist of the macro b. A clock path extending to a clock tree terminating driver means a clock path between the clock tree terminating driver and an external Signal inputting pin (or external clock inputting pin). FIG. 9 shows removal of the description on the clock paths which extend to the clock tree terminating drivers. As shown in FIG. 9, the netlist merging unit 25 removes the cells 51a to 51h, the cells 52a to 52c, the external Signal inputting pins 54a to 54c and clock nets which extend to the clock tree terminating drivers 52d to 52g and are connected to the external Signal inputting pins, of the macro b. Then, the netlist merging unit 25 makes a netlist which is in a state shown in a right figure of FIG. 9.

Step S15-2: The netlist merging unit 25 copies description on the clock paths related to the macro b from the post global-clock distribution processing netlist to a work memory area. The paths copied are paths extend from the PLL circuit to the clock-tree terminating drivers.

Figure 10:
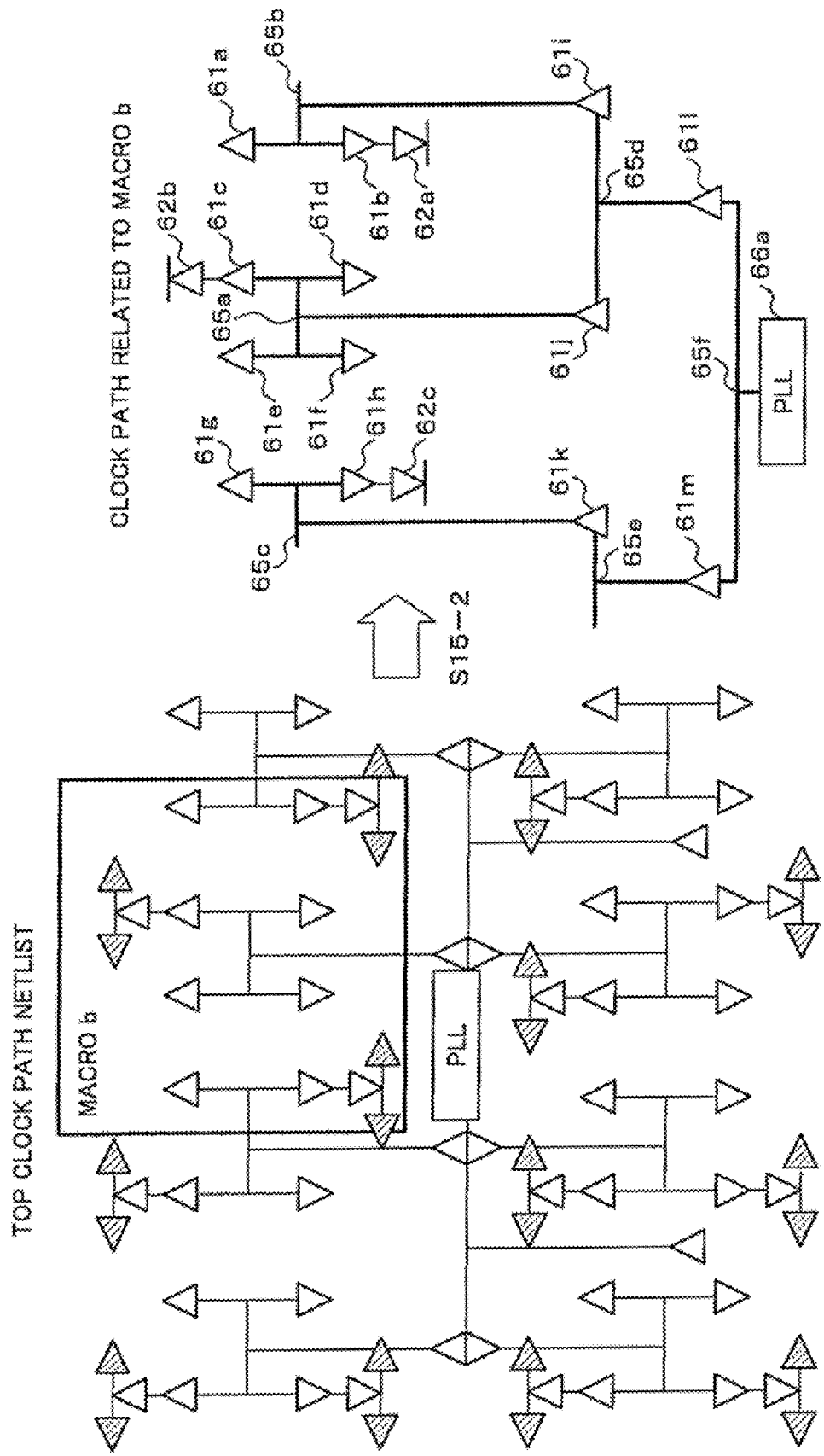
FIG. 10 shows a copy of description on a clock path, which extends from a PLL circuit to the clock tree terminating driver, in step S15-2.

FIG. 10 shows the copy of description on the clock paths in step S15-2. The clock path which extends from the PLL circuit to a clock tree terminating driver means a clock path which extends from the PLL circuit to the clock tree terminating driver in a global clock list (for example, post global clock distributing processing top netlist). As shown in FIG. 10, the netlist merging unit 25 traces the post global clock distributing processing top netlist 12 from the clock tree termination drivers, which are included in the post layout processing macro netlist, toward the PLL circuit. Firstly, the netlist merging unit 25 carries out the tracing from a clock tree termination driver to an input net which exists before (closer to the PLL circuit than) the clock tree termination driver and then, tracing from the input net to a driver which exists before the input net and moreover, tracing from the driver to an input net which exists before the input net. That is, the netlist merging unit 25 carries out an iteration of the tracings mentioned above. When the tracing reaches the PLL circuit, the netlist merging unit 25 determines the scope of the clock paths of which description is to be copied to the work memory area and copies the description. The netlist merging unit 25 carries out repetition of the iteration whose repetition number is corresponding to the number of the clock tree terminating drivers. In this way, it is possible for the netlist merging unit 25 to obtain the clock path related to the macro b.

Figure 11:
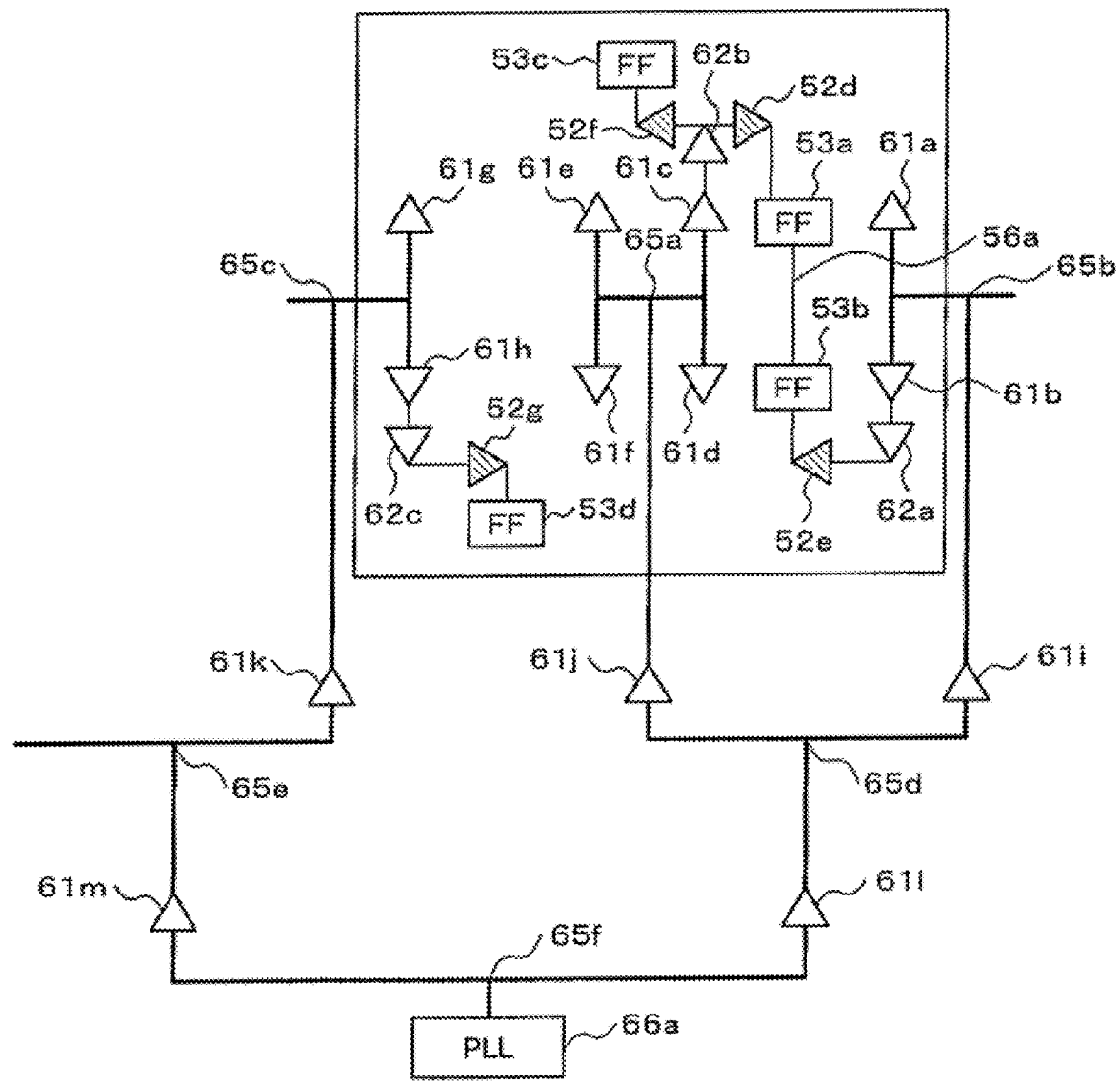
FIG. 11 shows an outside macro clock path including macro netlist.

Step S15-3: The netlist merging unit 25 merges the description on the clock paths, which is made in Step S15-2 and stored in the work memory area, with the netlist from which description on the clock paths extending to the clock tree termination drivers is removed in Step S15-1 and then, makes the outside macro clock path including macro netlist. FIG. 11 shows the outside macro clock path including macro netlist.

Step S16: The outside macro clock path including macro netlist 16 is supplied to the delay calculating unit 26. The delay calculating unit 26 carries out calculation of delays, on the basis of the RC simulation with reference to the cell library 17, and outputs the inside macro circuit delay information 18. Details of Step S16 including the delay calculating unit 26 is referable to Japanese Patent Application Laid-Open No. 2001-273338, Japanese Patent Application Laid-Open No. 2000-259686, Japanese Patent Application Laid-Open No. 2000-305966, Japanese Patent Application Laid-Open No. 2000-250950 or the like.

Step 317: The outside macro clock path including macro netlist 16 and the global clock path delay information 13 are supplied to the CRPR base timing analyzing unit 27. The CRPR base timing analyzing unit 27 annotates the global clock path delay information 13 to the outside macro clock path including macro netlist 16. Then, the inside macro circuit delay information 18 made in Step 16 is supplied to the CRPR base timing analyzing unit 27. The CRPR base timing analyzing unit 27 annotates the wiring delay information and the gate delay information of each network in the macro b to the outside macro clock path including netlist 16.

Step S18: The CRPR base timing analyzing unit 27 carries out the timing analysis, based on CRPR with reference to the outside macro clock path including macro netlist 16, to which the delay information obtained in Step S17 is annotated, and the timing constraints information 19. Since inputting the outside macro clock path including macro netlist 16 makes it possible to recognize the common points of the clock paths outside the macro, it is possible for the CRPR base timing analyzing unit 27 to calculate clock skew, based on CRPR. Moreover, the CRPR base timing analyzing unit 27 carries out the timing analysis on the basis of CRPR by use of the calculated clock skew. Specifically, the CRPR base timing analyzing unit 27, for example, checks whether delays of the clock paths or delays of the signal paths satisfy the timing constraints by use of the calculated clock skew, and outputs the timing analysis information 10. At this point of time, the timing analyzing apparatus 200 completes the timing analysis, which is based on CRPR, on the macro b.

Next, an effect of the first exemplary embodiment of the present invention will be described. The first exemplary embodiment of the present invention has an effect that it is possible to design a circuit with no excessive design margin. The reason is that the CRPR base timing analyzing unit 27 carries out the timing analysis on the clock paths inside and outside the macro, based on CRPR.

That is, according to the first exemplary embodiment of the present invention, the netlist merging unit 25 merges the post layout processing macro netlist 15 with the post global clock distributing top netlist 12, which includes the global clock path, and makes the outside macro clock path including macro netlist 16.

Then, the outside macro clock path including macro netlist 16 and the global clock path delay information 13 are supplied to the CRPR base timing analyzing unit 27, and the CRPR base timing analyzing unit 27 recognizes the clock paths outside the macro. As a result, it is possible to carry out the timing analysis on the macro including the clock paths outside the macro, based on CRPR and therefore, it is possible to remove the excessive design margin and to contribute to the optimum LSI design.

In contrast, according to the method for the timing analysis on the macro without applying the present invention, the timing analysis is carried out by use of only the post layout processing macro netlist 15 which can recognize only clock paths of inside the macro, as described later.

Specific-description on the point mentioned above will be made later, exemplifying the timing analysis on the paths whose starting point and terminating point are FF53a and FF53b. According to the method for the timing analysis on the macro without applying the present invention, a circuit of the macro is recognized as shown in FIG. 8. Therefore, with regard to the paths whose starting point and terminating point are FF53a and FF53b, a clock path related to FF53a, from the external clock inputting pin 54b to the clock pin of FF53a, and a clock path related to FF53b, from the external clock inputting pin 54a to the clock pin of FF53b can be recognized, but other paths related to FF53a and FF53b can not be recognized, according to the method. As a result, it is impossible to recognize how long the common sections are or where the common points exist on the clock path related to FF53a and the clock path related to FF53b before the external clock inputting pins 54a and 54b respectively, according to the method. Therefore, it is impossible to carry out the timing analysis, based on CRPR, and then, the timing analysis has to be carried out by use of larger clock skew than necessary.

According to the first exemplary embodiment of the present invention, a circuit of the macro is recognized as shown in FIG. 11. With regard to the paths whose starting point and terminating point are FF53a and FF53b, the clock path related to FF53a, from PLL66a outside the macro to the clock pin of FF53a, and the clock path related to FF53b, from PLL66a to the clock pin of FF53b can be recognized. Therefore, it is possible to recognize how long the common sections are or where the common points exist on the clock path related to FF53a and the clock path related to FF53b outside the macro. As a result, it is possible for the method to carry out the timing analysis, based on CRPR and to remove the excessive design margin on the clock skew which is used in the timing analysis, and to contribute to the optimum LSI design.

Moreover, the first exemplary embodiment of the present invention adopts the clock distributing method that the clock distribution is carried out for the whole of the chip at a time of the top processing and a clock path inside a macro, is cut out in the macro processing from the clock paths distributed on the whole of the chip in the macro processing and the clock distribution is limited to connecting the clock tree terminating drivers with FFs inside the macro. As a result, the number of stages of the clock tree of the whole chip is optimized, and it is possible to make the clock skew small.

Figure 12:
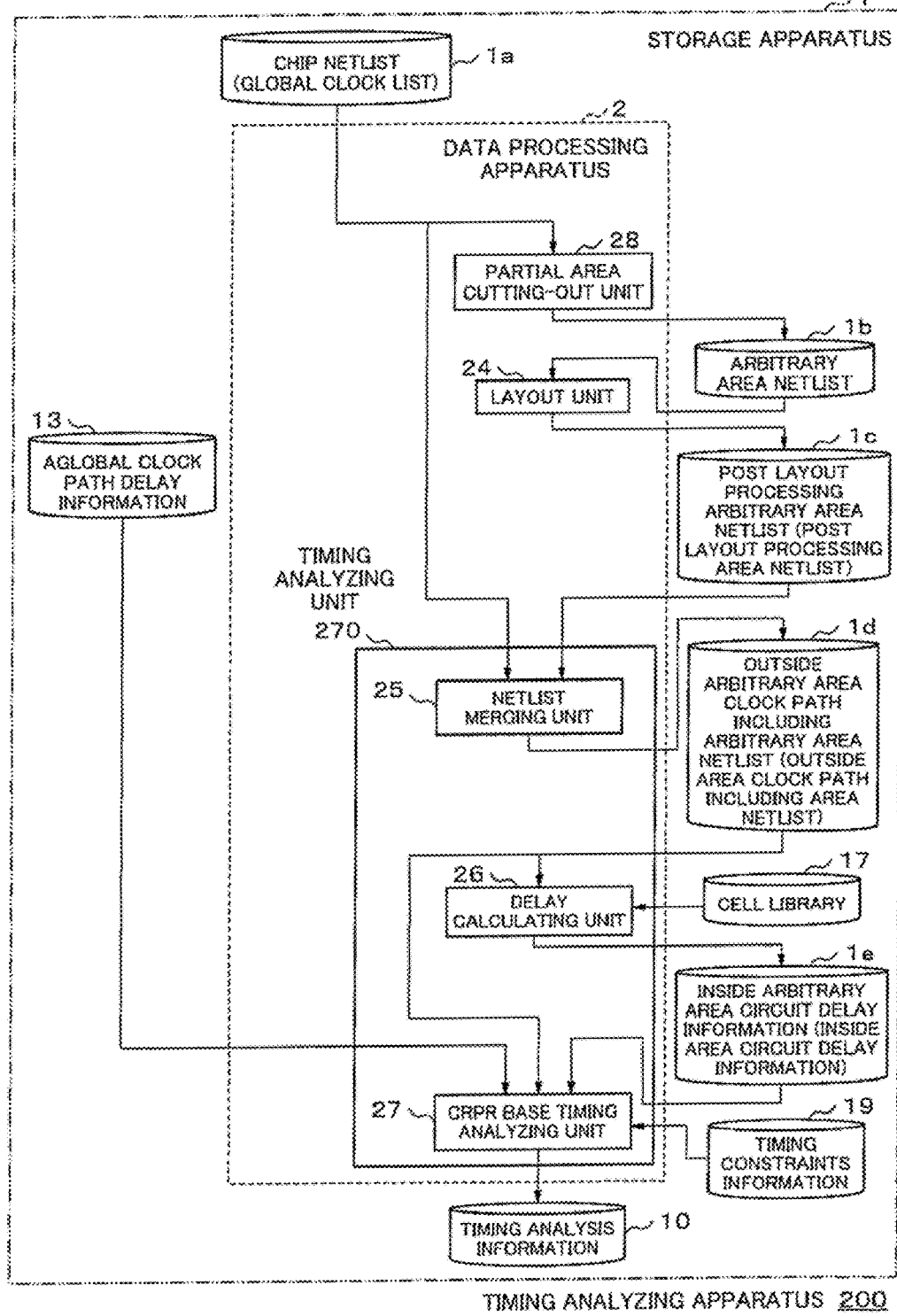
FIG. 12 shows an alternative of the first exemplary embodiment of the present invention.

Next, an alternative of the first exemplary embodiment of the present invention will be described in detail with reference to drawings. FIG. 12 shows the alternative of the first exemplary embodiment. In comparison, the alternative of the first exemplary embodiment is different from the first exemplary embodiment in a point that the timing analysis target is not a macro but an arbitrary area and the timing analysis target is not the post global clock distributing processing top netlist 12 but a chip netlist 1a.

As shown in FIG. 12, the delay analyzing apparatus 200 includes the data processing apparatus 2, which operates with program control, and the storage apparatus 1 such as a hard disk.

The storage apparatus 1 stores the chip netlist 1a, the global clock path delay information 13, the cell library 17 and the timing constraints information 19. Moreover, the storage apparatus 1 stores an arbitrary area netlist 1b, a post layout processing arbitrary area netlist 1c, an outside arbitrary area clock path including arbitrary area netlist 1d, an inside arbitrary area circuit delay information 1e and the timing analysis information 10 as output information.

The chip netlist 1a is outputted from a layout tool after the layout processing and the wiring processing for all cells on a whole of a chip have been completed. The storage apparatus 1 stores the chip netlist 1a in advance.

The arbitrary area netlist 1b is a netlist which indicates circuits in the arbitrary area which is cut out from the chip netlist 1a, and the arbitrary area netlist 1b is outputted from a partial area cutting-out unit 28.

The post layout processing arbitrary area netlist 1c is a netlist which indicates a state after a modified layout processing has been carried out for the arbitrary area netlist 1b, and the post layout processing arbitrary area netlist 1c is outputted from the layout unit 24.

The outside arbitrary area clock path including arbitrary area netlist 1d is a netlist created by merging, after cutting out description on clock paths related to an arbitrary area from the chip netlist 1a, the post layout processing arbitrary area netlist 1c with the cut-out description on clock paths. The outside arbitrary area clock path including arbitrary area netlist 1d is outputted from a netlist merging unit 25.

The inside arbitrary area circuit delay information 1e is information on the wiring delays and the gate delays, which are calculated by the delay calculating unit 26, of each network inside the arbitrary area. Other constituent of the storage apparatus 1 is the same as one of the first exemplary embodiment of the present invention shown in FIG. 4.

The data processing apparatus 2 includes the partial area cutting-out unit 28, the layout unit 24, the netlist merging unit 25, the delay calculating unit 26 and the CRPR base timing analyzing unit 27. The netlist merging unit 25, the delay calculating unit 26 and the CRPR base timing analyzing unit 27 compose the timing analyzing unit 270.

The partial area cutting-out unit 28 outputs the arbitrary area netlist 1b which indicates circuits inside the arbitrary area cut out from the chip netlist 1a. Other constituent of the data processing apparatus 2 is the same as one of the first exemplary embodiment shown in FIG. 4.

Next, an operation of the alternative of the first exemplary embodiment will be described with reference to drawings.

Figure 13:
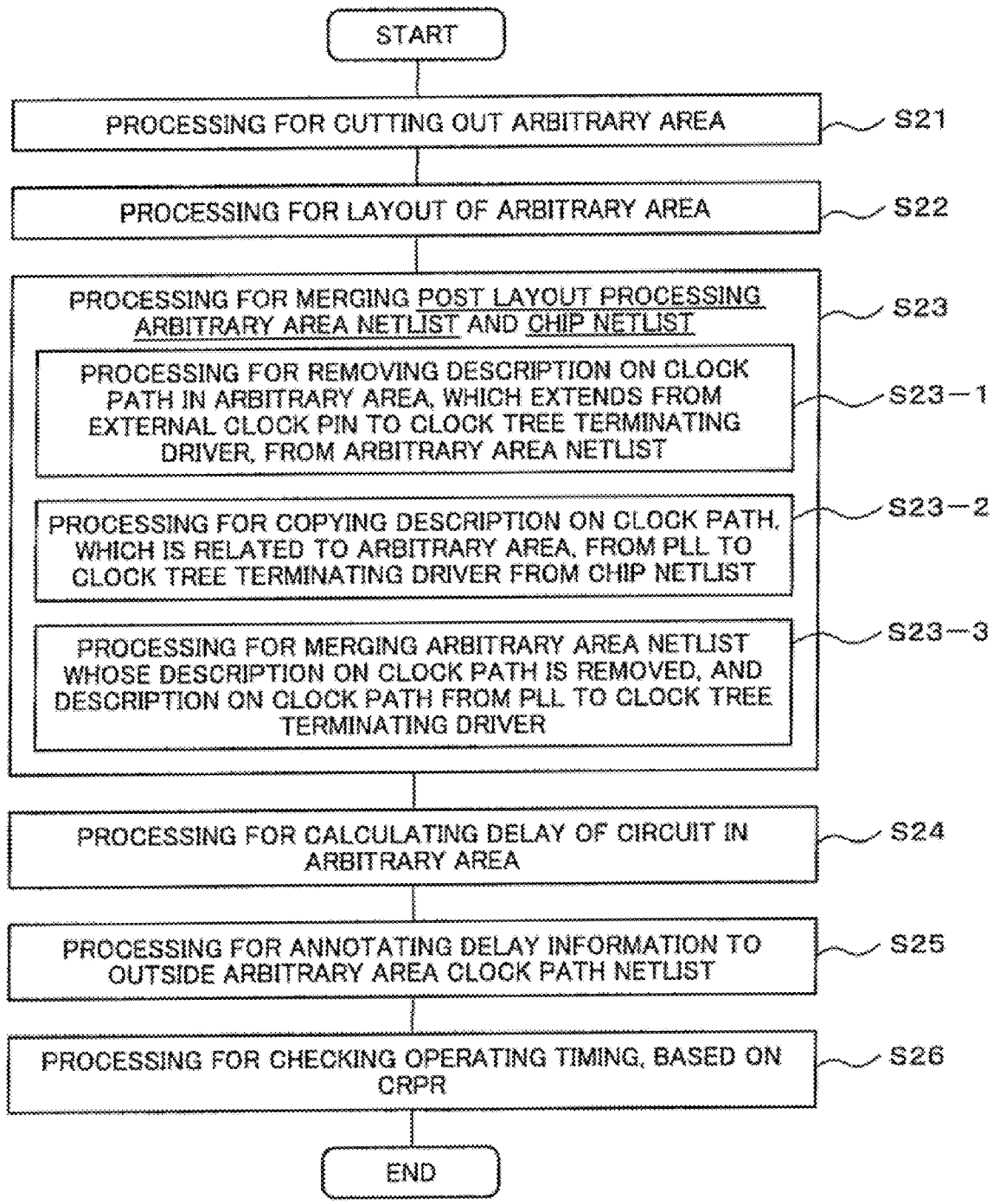
FIG. 13 is a flowchart showing timing analysis on an arbitrary area, based on CRPR.

FIG. 13 is a flowchart showing the timing analysis on the arbitrary area, based or CRPR.

Figure 14:
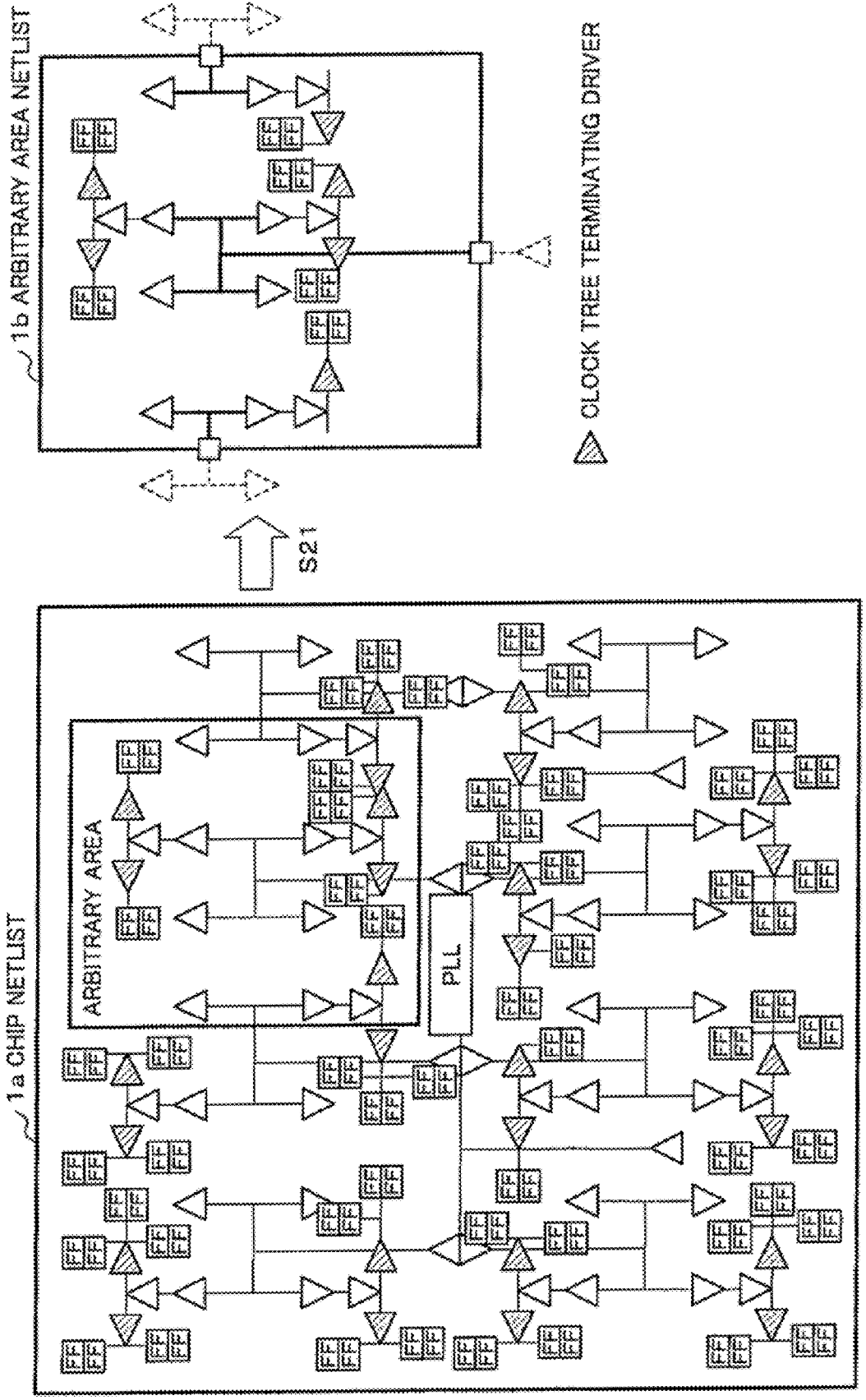
FIG. 14 shows processing for cutting out the arbitrary area in Step S21.

Step S21: The chip netlist 1a is supplied to the partial area cutting-out unit 28, and the partial area cutting-out unit 28 outputs the arbitrary area netlist 1b which includes the cut-out circuits inside the arbitrary area. FIG. 14 shows processing for cutting out the arbitrary area in Step S21. Since processing up to the chip layout processing is carried out for the chip netlist 1a, the partial area cutting-out unit 28 can recognize the clock paths in the chip netlist 1a. Therefore, the partial area cutting-out unit 28 makes external clock pins of the arbitrary area at cross points of the clock paths with the boundary of the arbitrary area, and cuts out the arbitrary area including the external clock pins thereof. The processing except for the processing of cutting out the external clock pins is referable to Japanese Patent Application Laid-Open No. 2007-257293 or the like.

Step S22: The arbitrary area netlist 1b is supplied to the layout unit 24, and the layout unit 24 carries out the layout processing, and outputs the post layout arbitrary area netlist 1c. Details of Step S22 by the layout unit 24 are referable to Japanese Patent Application Laid-Open No. 2005-284826, Japanese Patent Application Laid-Open No. 2007-34668, Japanese Patent Application Laid-Open No. 2000-242675 or the like.

Step S23: The post layout arbitrary area netlist 1c and the chip netlist 1a are supplied to the netlist merging unit 25, and the netlist merging unit 25 carries out processing for merging the netlists together. The netlist merging unit 25 copies description of clock paths distributed inside the arbitrary area from the clock source (PLL circuit) outside the arbitrary area, from the chip netlist 1a to a work area. The netlist merging unit 25 replaces the description on the clock paths of the post layout processing arbitrary area netlist 1c with the description on the clock paths in the working area. As a result, the netlist merging unit 25 outputs the outside arbitrary area clock path including arbitrary area netlist 1d which includes a clock paths from the clock source outside the arbitrary area, to FFs inside the arbitrary area. The processing of Step S23 is similar to the processing of Step S15 in FIG. 4, while there is difference between the macro and the arbitrary area and between the post global clock distributing processing top netlist 12 and the chip netlist 1a.

Step S24: The outside arbitrary area clock path including netlist 1d is supplied to the delay calculating unit 26, and the delay calculating unit 26 carries out calculation of delays, on the basis of the RC simulation with reference to the cell library 17, and outputs the inside macro circuit delay information 1e. Details of Step S24 by the delay calculating unit 26 are referable to Japanese Patent Application Laid-Open No. 2001-273338, Japanese Patent Application Laid-Open No. 2000-259686, Japanese Patent Application Laid-Open No. 2000-305966, Japanese Patent Application Laid-Open No. 2000-250950 or the like.

Step S25: The outside arbitrary area clock path including arbitrary area netlist 1d and the global clock path delay information 13 are supplied to the CRPR base timing analyzing unit 27. The CRPR base timing analyzing unit 27 annotates the global clock path delay information 13 to the outside arbitrary area clock path including arbitrary area netlist 1d. Moreover, the inside arbitrary area circuit delay information 1e which is made in Step S24 is supplied to the CRPR base timing analyzing unit 27 and then, the CRPR base timing analyzing unit 27 annotates the wiring delay information and the gate delay information of each network in the arbitrary area to the outside arbitrary area clock path including netlist 1d.

Step S26: The CRPR base timing analyzing unit 27 carries out the timing analysis on the basis of CRPR with reference to the outside arbitrary area clock path including arbitrary area netlist 1d, to which the delay information was annotated in Step S25, and the timing constraints information 19. Since inputting the outside arbitrary area clock path including arbitrary area netlist 1d makes it possible to recognize the common points of the clock paths outside the arbitrary area, it is possible for the CRPR base timing analyzing unit 27 to calculate clock skew based on CRPR. And the CRPR base timing analyzing unit 27 carries out the timing analysis on the basis of CRPR by use of the calculated clock skew. Specifically, the CRPR base timing analyzing unit 27, for example, checks whether delays of the clock paths or delays of the signal paths satisfy the timing constraints respectively by use of the calculated clock skew, and outputs the timing analysis information 10. At this point of time, the timing analyzing apparatus 200 completes the timing analysis based on CRPR.

Next, a second exemplary embodiment of the present invention will be described in detail with reference to drawings. According to the second exemplary embodiment, as will be mentioned later, the CRPR base timing analyzing unit 27 calculates clock skew inside the macro neglecting delays caused in the common points of the clock paths inside the macro, based on the inside macro circuit delay information 18 and the post layout processing macro netlist 15. Then, the CRPR base timing analyzing unit 27 adds clock skew outside the macro, which is calculated neglecting delays caused in the common points outside the macro, to clock skew inside the macro and consequently, obtains clock skew of clock paths outside and inside the macro.

Figure 15:
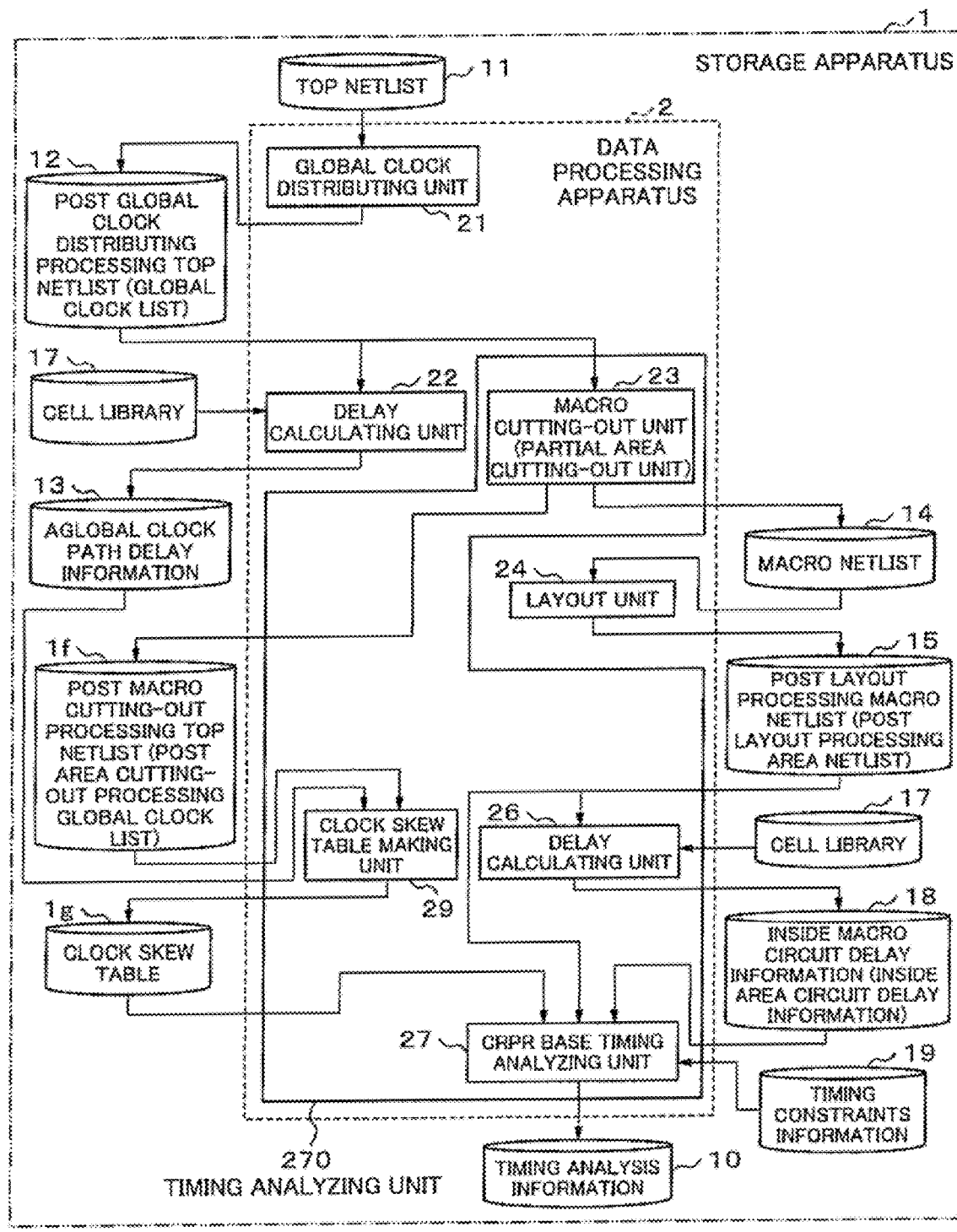
FIG. 15 shows a timing analyzing apparatus according to a second exemplary embodiment of the present invention.

FIG. 15 shows a timing analyzing apparatus according to the second exemplary embodiment.

The timing analyzing apparatus 200 includes the data processing apparatus 2, which operates with program control, and the storage apparatus 1 such as a hard disk.

The storage apparatus 1 stores the top netlist 11, the cell library 17 and the timing constraints information 19. Moreover, the storage apparatus 1 stores the post global clock distributing processing netlist 12, a post macro cutting-out processing top netlist 1*f*, the global clock path delay information 13, a clock skew table 1*g*, the macro netlist 14, the post layout processing macro netlist 15, the inside macro circuit delay information 18, and the timing analysis information 10, as output information.

Figure 17:
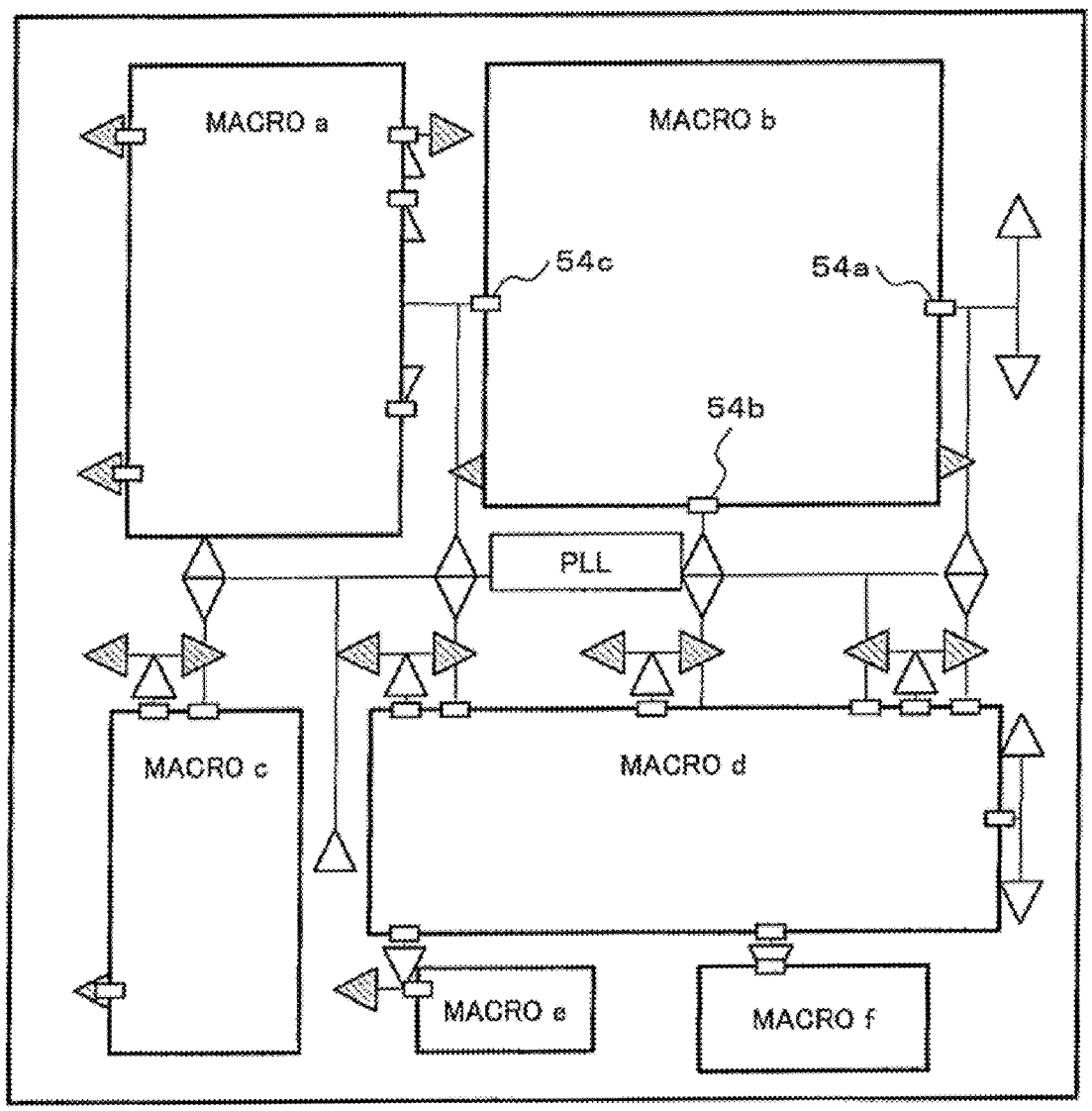
FIG. 17 shows a post macro cutting-out processing top netlist 1f.

FIG. 17 shows the post macro cutting-out processing top netlist 1*f*. The post macro cutting-out processing top netlist 1*f* is the post global clock distributing processing top netlist 12 from which macros have been cut out by the macro cutting-out unit 23.

The clock skew table 1*g* is made by a clock skew table making unit 29 and stores clock skew which is calculated on the basis of CRPR, for each pair of external clock pins of the macro. Other constituent of the storage apparatus 1 is the same as one of the first exemplary embodiment in FIG. 4.

The data processing apparatus 2 includes the global clock distributing unit 21, the delay calculating unit 22, the macro cutting-out unit 23, the layout unit 24, the clock skew table making unit 29, the delay calculating unit 26 and the CRPR base timing analyzing unit 27. The macro cutting-out unit 23, the clock skew table making unit 29, the delay calculating unit 26 and the CRPR base timing analyzing unit 27 compose the timing analyzing unit 270.

The macro cutting-out unit 23 outputs both the macro netlist 14, which indicates circuits inside the macro cut out from the post global clock distribution processing netlist 12, and the post macro cutting-out processing top netlist 1*f*.

The clock skew table making unit 29 calculates clock skew outside macros on the basis of CRPR (excluding delays in common points) with reference to the post macro cutting-out processing top netlist 1*f* and the global clock path delay information 13. Then, the clock skew table making unit 29 makes a table of clock skew for each pair of external clock pins in the same macro and outputs the table as the clock skew table 1*g*.

The CRPR base timing analyzing unit 27 calculates delays of the signal paths, delays of the clock paths and clock skew with reference to the post layout processing macro netlist 15, the clock skew table 1*g*, the inside macro circuit delay information 18 and the timing constraints information 19. Then, the CRPR base timing analyzing unit 27 checks whether delays of the clock paths and delays of the signals satisfy the timing constraints respectively, and outputs these calculation results or the like as the timing analysis information 10.

In the processing of calculating clock skew, the CRPR base timing analyzing unit 27 obtains CRPR based clock skew of the clock paths outside the macro from the clock skew table 1*g*. On the other hand, in the processing of calculating clock skew of the circuits inside the macro, the CRPR base timing analyzing unit 27 calculates clock skew on the basis of CRPR, neglecting delays in common points in the macro. Afterward, the CRPR base timing analyzing unit 27 checks whether delays of the clock paths and delays of the signal paths satisfy the timing constraints respectively, by use of clock skew obtained by adding clock skew inside the macro and outside the macro. Other constituent of the data processing apparatus 2 is the same as one of the first exemplary embodiment in FIG. 4.

The CRPR base timing analyzing unit 27 obtains delay information on the clock path between the clock pin of the start point FF (the first point) in a circuit inside the macro and one external clock pin of a pair of external clock pins, and delay information of the clock path between the clock pin of the end point FF (the second point) in the circuit inside the macro and the other external clock pin of the same pair of external clock pins, from the inside macro circuit delay information 18 and, obtains clock skew between the two external clock pins of the pair from the clock skew table 1*g*, and then, calculates clock skew between the first point and second-point, based on these three information obtained above.

Figure 16:
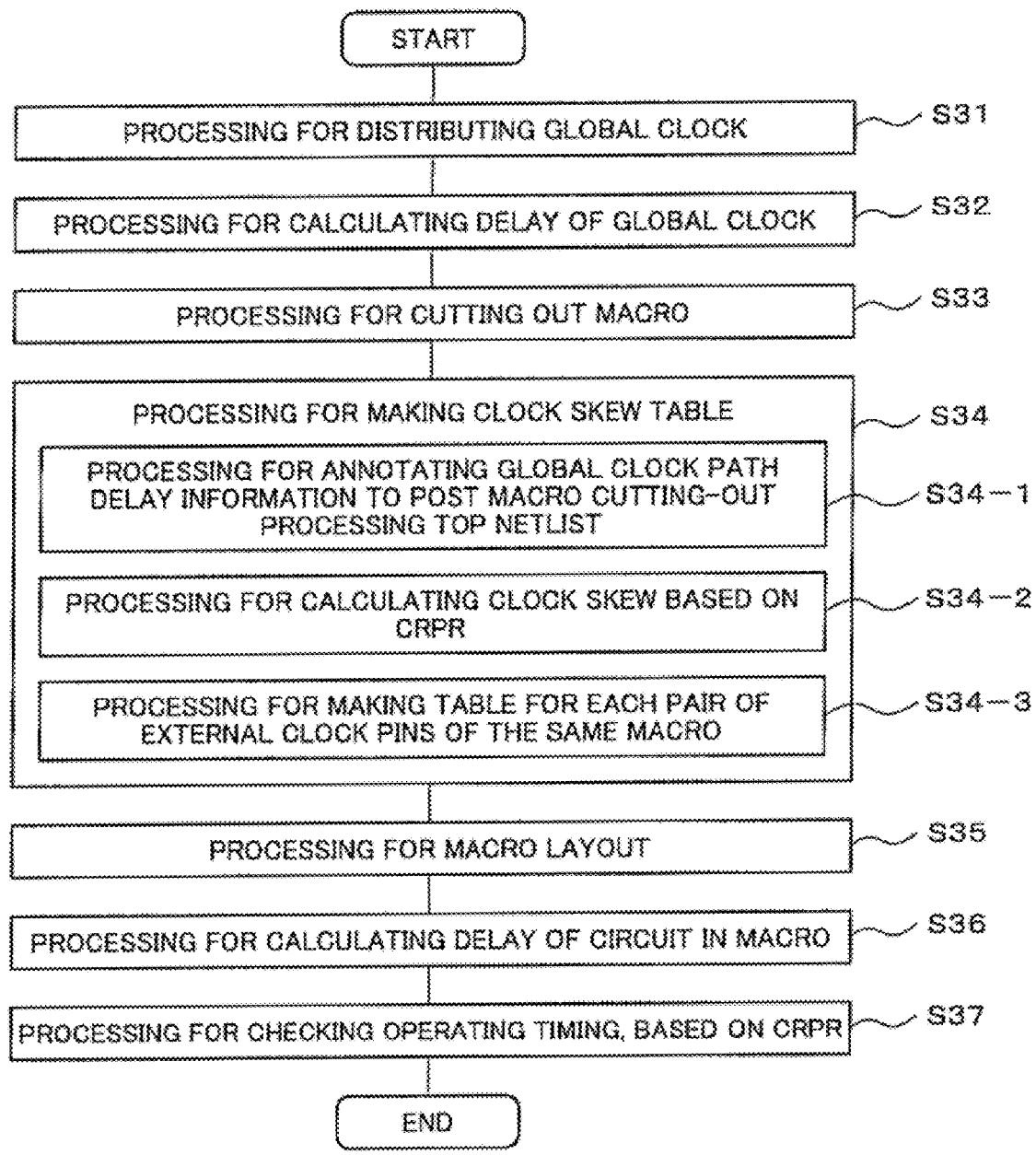
FIG. 16 is a flowchart showing timing analysis on the macro, based on CRPR.

Now, an operation of the second exemplary embodiment will be described in detail with reference to drawings. FIG. 16 is a flowchart which shows the timing analysis on the macro, based on CRPR. Steps S31 and S32 are equivalent respectively to Steps S11 and S12 of the first exemplary embodiment which have been already described.

Step S33: The post global clock distributing processing top netlist 12 is supplied to the macro cutting-out unit 23. The macro cutting-out unit 23 outputs the macro netlist 14 (FIG. 7) for the cut-out circuits inside the macro, and the post macro cutting-out processing top netlist 1*f* (FIG. 17). The clock distributing processing for the whole of the chip is carried out in Step S31 and the clock paths are distributed throughout the macro. The macro cutting-out unit 23 makes the external clock pins at cross points of the clock paths with the boundary of the macro and cuts out the macro including the external clock pins. Cutting-out processing except for the clock pin cutting-out is referable to Japanese Patent Application Laid-Open No. 2008-9787, Japanese Patent Application Laid-Open No. 2005-235804 or the like.

Step S34: The post macro cutting-out processing top netlist 1*f* and the global clock path delay information 13 are supplied to the clock skew table making unit 29. Then, the clock skew table making unit 29 executes the processing to make the clock skew table. Step 34 is divided into steps S34-1 to S34-3 and the processing is described in detail according to the divided steps.

Step S34-1: The post macro cutting-out processing top netlist 1*f* and the global clock path delay information 13 are supplied to the clock skew table making unit 29. The clock skew table making unit 29 annotates the global clock path delay information 13 to the post macro cutting-out processing top netlist 1*f*. In detail, the clock skew table making unit 29 annotates the global clock path delay information 13 only to cells and nets which exist in the post macro cutting-out processing top netlist 1*f*. In other words, the clock skew table making unit 29 does not annotate the delay information to cells and nets in the macro.

Step S34-2: The clock skew table making unit 29 calculates clock skew for each pair of external pins of the same macro, in assumption that the delay in a common point (a clock path shared by two paths from the clock source to each external pin of the pair) outside the macro is zero (on the basis of CRPR).

Step S34-3: The clock skew table making unit 29 makes the clock skew table 1*g* from the clock skew, which is calculated in Step 34-2 on the basis of CRPR, of each pair of external clock pins of the same macro. Then, the clock skew table making unit 29 outputs the clock skew table 1g. As an example of the clock skew table 1g, FIG. 18 shows the clock skew table of the macro b in FIG. 17. For example, in case that the CRPR base timing analyzing unit 17 retrieves clock skew of a path from the external clock pin 54a of the macro b as a start point clock pin to the external clock pin 54b as a end point clock pin with reference to this table, the table indicates that the clock skew is 120.

Step S35 and Step S36 are the same as Step S14 and Step S16 respectively which are shown in FIG. 5.

Step 37: The post layout processing macro netlist 15, the is inside macro circuit delay information 18 and the clock skew table 1g are supplied to the CRPR base timing analyzing unit 27. Then, the CRPR base timing analyzing unit 27 carries out the timing analysis, based on CRPR. In case of the clock paths inside the macro, the CRPR base timing analysis unit 27 calculates the clock skew on the basis of CRPR on a recognizable common points inside the macro. On the other hand, in case of the clock paths outside the macro, the CRPR base timing analyzing unit 27 obtains clock skew based on CRPR from the clock skew table 1g which is made in Step S34. The CRPR base timing analyzing unit 27 applies the clock skew obtained by adding the clock skew inside the macro and the clock skew outside the macro, to the timing analysis, for example, to checking whether delays of the clock paths or delays of the signal paths satisfy the timing constraints. As a result, the CRPR base timing analyzing unit 27 carries out the timing analysis on both clock paths inside the macro and clock paths outside the macro, based on CRPR, and outputs the timing analysis information 10. At this point of time, the timing analyzing apparatus 200 completes the timing analysis of the macro b, based on CRPR.

Figure 19:
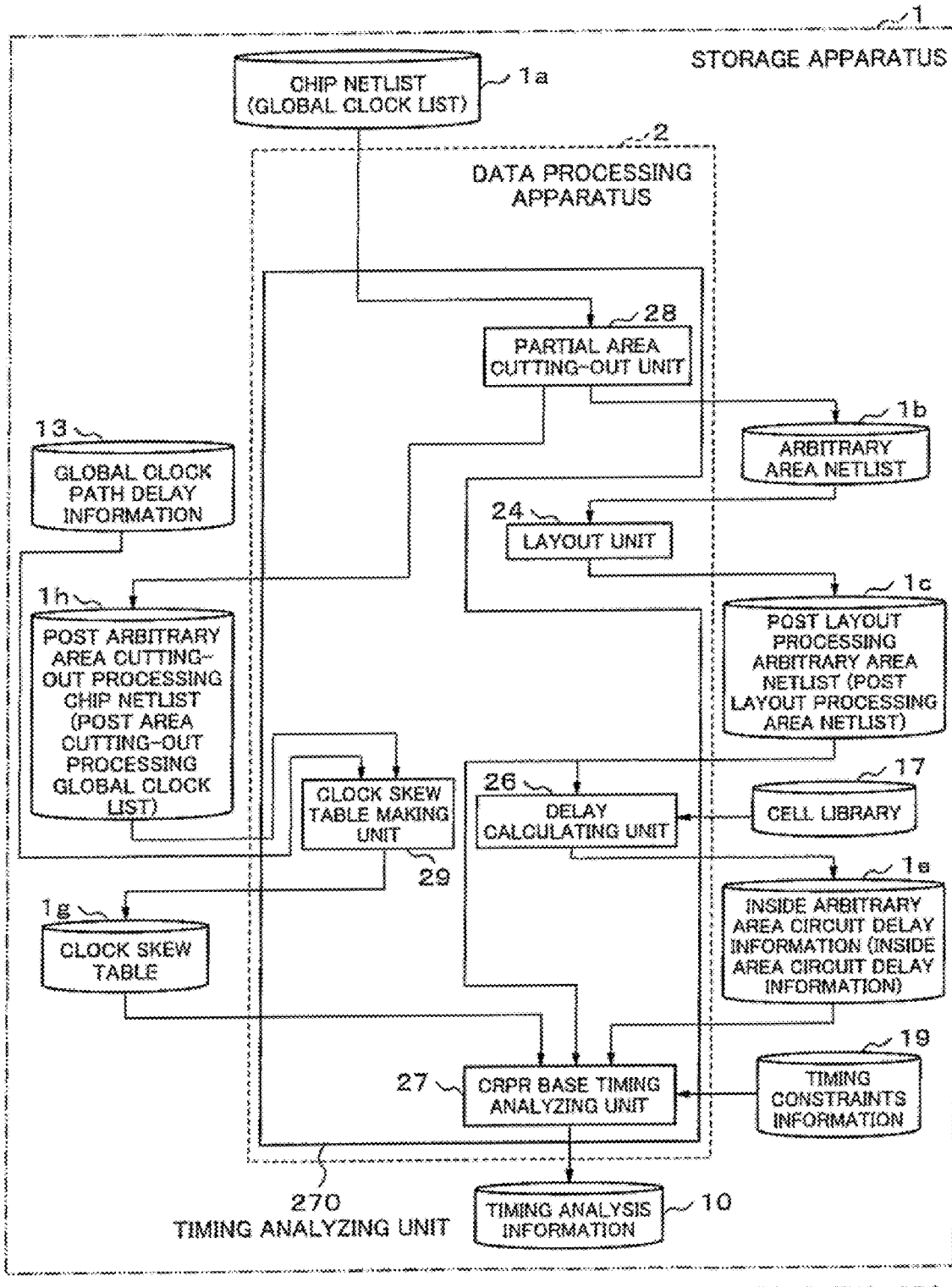
FIG. 19 shows an alternative of the second exemplary embodiment of the present invention.

Next, an alternative of the second exemplary embodiment will be described in detail with reference to drawings. FIG. 19 shows the alternative of the second exemplary embodiment. In comparison with the second exemplary embodiment, the alternative of the second exemplary embodiment is different in a point that the timing analysis object is not a macro but an arbitrary area, and the timing analysis object is not the post global clock distributing processing top netlist 12 but the chip netlist 1a.

As shown in FIG. 19, the timing analyzing apparatus 200 includes the data processing apparatus 2 which operates with program control, and the storage apparatus 1 such as a hard disk.

The storage apparatus 1 stores the chip netlist 1a, the global clock path delay information 13, the cell library 17 and the timing constraints information 19. Moreover, the storage apparatus 1 stores a post arbitrary area cutting-out processing chip netlist 1h, the clock skew table 1g, the arbitrary area netlist 1b, the post layout processing arbitrary area netlist 1c, the inside arbitrary area circuit delay information 1e and the timing analysis information 10, as output information.

Figure 21:
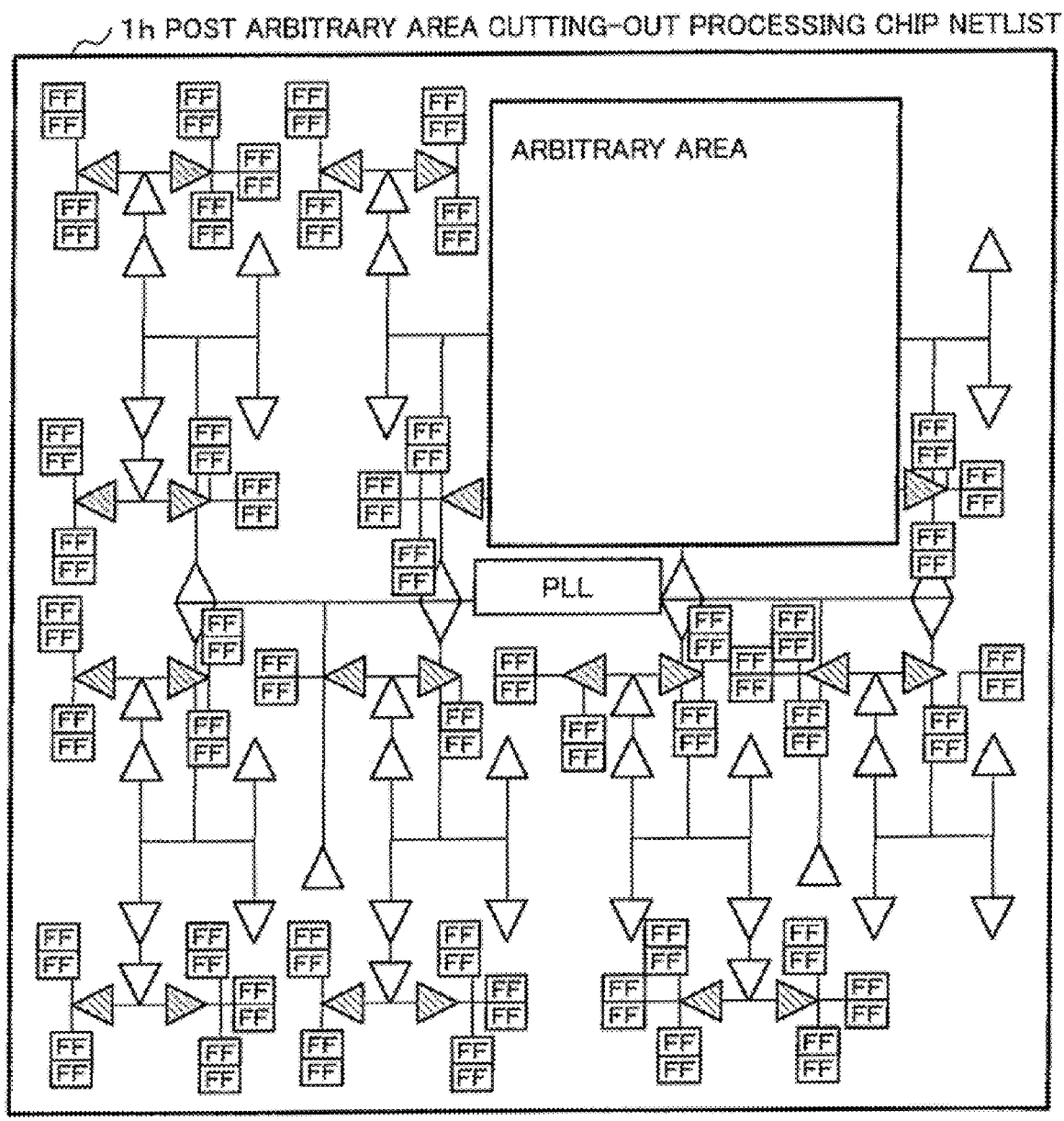
FIG. 21 shows a post arbitrary area cutting-out processing chip netlist 1h.

The post arbitrary area cutting-out processing chip netlist 1h is the chip netlist 1a from which arbitrary areas have been cut out by the partial area cutting-out unit 28. FIG. 21 shows the post arbitrary area cutting-out processing chip netlist 1h.

The clock skew table 1g is made by the clock skew table making unit 29 and stores clock skew which is calculated on the basis of CRPR, for each pair of external clock pins of the same area. Other constituent of the storage apparatus 1 is the same as one of the alternative of the first exemplary embodiment in FIG. 12.

The data processing apparatus 2 includes the partial area cutting-out unit 28, the layout unit 24, the clock skew table making unit 29, the delay calculating unit 26 and the CRPR base timing analyzing unit 27. The partial area cutting-out unit 28, the clock skew table making unit 29, the delay calculating unit 26 and the CRPR base timing analyzing unit 27 compose the timing analyzing unit 270.

The partial area cutting-out unit 28 outputs both the arbitrary area netlist 1b, which indicates circuits inside the arbitrary area cut out from the chip netlist 12, and the post arbitrary area cutting-out processing chip netlist 1h.

The clock skew table making unit 29 calculates clock skew outside arbitrary areas on the basis of CRPR (excluding delays in common points) with reference to the post arbitrary area cutting-out processing chip netlist 1h and the global clock path delay information 13. Then, the clock skew table making unit 29 makes a table of clock skew for each pair of external clock pins in the same area and outputs the table as the clock skew table 1g.

The CRPR base timing analyzing unit 27 calculates delays of the signal paths, delays of the clock paths and clock skew with reference to the post layout processing arbitrary area netlist 1c, the clock skew table 1g, the inside arbitrary area circuit delay information 1e and the timing constraints information 19. Then, the CRPR base timing analyzing unit 27 checks whether delays of the clock paths and delays of the signal paths satisfy the timing constraints respectively, and outputs these calculation results or the like as the timing analysis information 10.

In the processing of calculating clock skew, the CRPR base timing analyzing unit 27 obtains CRPR based clock skew of the clock paths outside the arbitrary area from the clock skew table 1g. On the other hand, in the processing of calculating clock skew of the circuits inside the arbitrary area, the CRPR base timing analyzing unit 27 calculates clock skew on the basis of CRPR, neglecting delays in a common points in the arbitrary area. Afterward, the CRPR base timing analyzing unit 27 checks whether delays of the clock paths and delays of the signal paths satisfy the timing constraints respectively, by use of clock skew obtained by adding clock skew inside the arbitrary area and outside the arbitrary area. Other constituent of the data processing apparatus 2 is the same as one of the exemplary embodiment in FIG. 12.

The CRPR base timing analyzing unit 27 obtains delay information on the clock path between the clock pin of the start point FF (the first point) in a circuit inside the arbitrary area and one external clock pin of a pair of external clock pins, and delay information of the clock path between the clock pin of the end point FF (the second point) in the circuit inside the arbitrary area and the other external clock pin of the same pair of external clock pins, from the inside arbitrary area circuit delay information 1e and, obtains clock skew between the two external clock pins of the pair from the clock skew table 1g, and then, calculates clock skew between the first point and second point, based on these three information obtained above.

Figure 20:
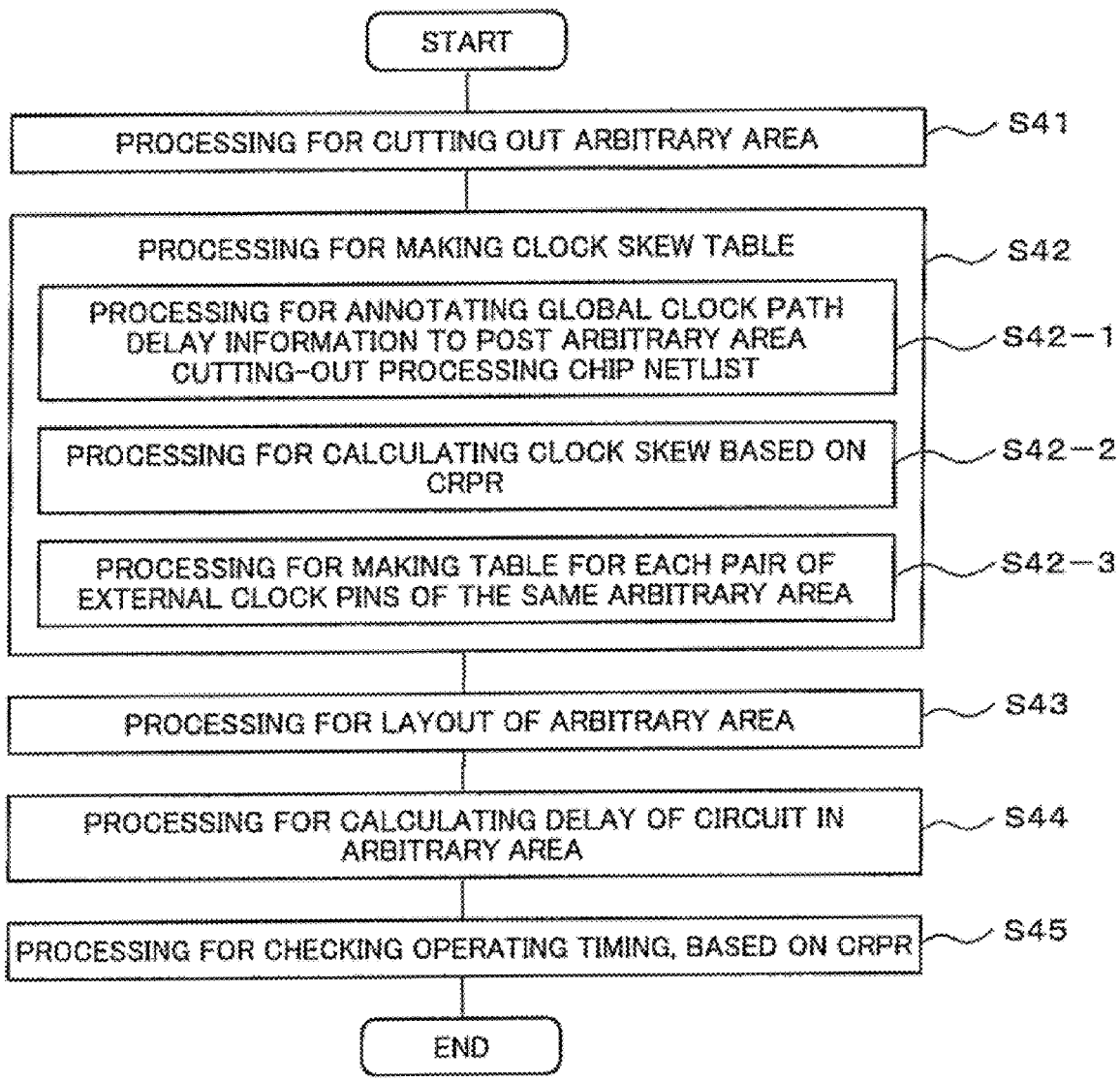
FIG. 20 is a flowchart showing timing analysis on the macro, based on CRPR.

Next, an operation of the alternative of the second exemplary embodiment will be described in detail with reference to drawings. FIG. 20 is a flowchart showing the timing analysis on the arbitrary area based on CRPR.

Step S41: The chip netlist 1a is supplied to the partial area cutting-out unit 28. Then, the partial area cutting-out unit 28 outputs the arbitrary area netlist 1b (FIG. 14) which includes the cut-out circuits inside the arbitrary area, and the post arbitrary cutting-out processing chip netlist 1h (FIG. 21). Since processing up to the chip layout processing is carried out for the chip netlist 1a, the partial area cutting-out unit 28 can recognize the clock paths in the chip netlist 1a. Therefore, the partial area cutting-out unit 20 makes external clock pins of the arbitrary area at cross points of the clock paths with the boundary of the arbitrary area, and cuts out the arbitrary area including the external clock pins thereof. The processing except for the processing of cutting out the clock pins is referable to Japanese Patent Application Laid-Open No. 2008-9787, Japanese Patent Application Laid-Open No. 2005-235804 or the like.

Step S42: The post arbitrary area cutting-out processing chip netlist 1*h* and the global clock path delay information 13 are supplied to the clock skew table making unit 29. Then, the clock skew table making unit 29 executes the processing for making the clock skew table. Specific processing is the same as Step 34 of the second exemplary embodiment in FIG. 16, while there is difference between the macro and the arbitrary area and between the top netlist and the chip netlist.

Step S43 and Step S44 are the same as Step S22 and Step S24 of the alternative of the first exemplary embodiment in FIG. 13.

Step S45: The post layout processing arbitrary area netlist 1*c*, the inside arbitrary area circuit delay information 1*e* and the clock skew table 1*g* are supplied to the CRPR base timing analyzing unit 27. Then, the CRPR base timing analyzing unit 27 carries out the timing analysis based on CRPR. In case of the clock paths inside the arbitrary area, the CRPR base timing analysis unit 27 calculates the clock skew on the basis of CRPR on a recognizable common points inside the arbitrary area. On the other hand, in case of the clock paths outside the arbitrary area, the CRPR base timing analyzing unit 27 obtains clock skew based on CRPR from the clock skew table 1*g* which is made in Step S42. The CRPR base timing analyzing unit 27 applies the clock skew obtained by adding the clock skew inside the arbitrary area and the clock skew outside the arbitrary area, to the timing analysis, for example, to checking whether delays of the clock paths or delays of the signal paths satisfy the timing constraints. As a result, the CRPR base timing analyzing unit 27 carries out the timing analysis on both clock paths inside the arbitrary area and clock paths outside the arbitrary area, based on CRPR, and outputs the timing analysis information 10. Specific description is the same as Step S37 of the second exemplary embodiment shown in FIG. 16, while there exists difference between the macro and the arbitrary area. At this point of time, the timing analyzing apparatus 200 completes the timing analysis of the arbitrary area b, based on CRPR.

The present invention has an effect that it is possible to carry out the circuit design with no excessive design margin.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A timing analyzing apparatus, comprising:
    a storage apparatus which stores a global clock list including information on clock paths inside and outside a partial area of an electronic circuit, and a post layout processing area netlist which is a netlist of the partial area after layout processing of circuits therein is executed; and
    a timing analyzing unit which recognizes a clock path between a clock source located outside the partial area and one of two points on the circuits located in the partial area, another clock path located between the clock source and the other point of the two points on the circuits located in the partial area and a common part that exists outside the partial area and is common in the two clock paths; and performs a CRPR calculation between the two points wherein clock delay of the common part is purposefully neglected, to judge whether the delay of a clock path and a signal path of the electronic circuit satisfies timing constraints using the calculated clock skew.

2. The timing analyzing apparatus according to claim 1, wherein the timing analyzing unit includes:
    a netlist merging unit which replaces description on a clock path between a clock tree terminating driver in the post layout processing area netlist and an external clock pin, which is located at a cross point of the periphery of the partial area and a clock path of the electronic circuit, with description in the global clock list on a clock path from the clock source to the clock tree terminating driver, to make an outside area clock path including area netlist;
    a delay calculating unit which calculates the delay of the circuit in the partial area, based on the outside area clock path including area netlist, to output inside area circuit delay information; and
    a CRPR base timing analyzing unit which carries out the CRPR calculation, based on the inside area circuit delay information and the outside area clock path including area netlist, to judge, using the calculated clock skew, whether the delay of a clock path or the delay of a signal path of the electronic circuit satisfies timing constraints.

3. The timing analyzing apparatus according to claim 2, comprising:
    a global clock distributing unit which is supplied with top netlist, in which the partial area is defined as a macro and a primitive cell is arranged therein, and distributes clock to outside and inside of the macro, and makes a post global clock distributing processing top netlist to store in the storage apparatus as the global clock list;
    a macro cutting-out unit which cuts out clock paths of the macro from the post global clock distributing processing top netlist; and
    a layout unit which carries out a circuit layout for the cut-out macro and makes a post layout processing macro netlist to store in the storage apparatus as the post layout processing area netlist.

4. The timing analyzing apparatus according to claim 2, comprising:
    a partial area cutting-out unit which cuts out clock paths of the partial area from a chip netlist; and
    a layout unit which carries out a circuit layout for the cut-out partial area and makes a post layout processing arbitrary area netlist to store in the storage apparatus as the post layout processing area netlist, wherein
    the global clock list corresponds to the chip netlist for which processing of arranging a cell and a wiring is carried out inside and outside the partial area of the electronic circuit.

5. The timing analyzing apparatus according to claim 1, wherein the timing analyzing unit includes:
    a partial area cutting-out unit which removes clock paths of the partial area from the global clock list to make a post area cutting-out processing global clock list;
    a clock skew table making unit which carries out the CRPR calculation for each pair of external clock pins, each external clock pin being located at a cross point of the periphery thereof and a clock path of the electronic circuit, based on delay information of the electronic circuit and the post area cutting-out processing global clock list, to store the calculated clock skew for each pair in a clock skew table;

a delay calculating unit which calculates the delay of the circuit in the partial area based on the post layout processing area netlist, to output the calculated delay in inside area circuit delay information; and a CRPR base timing analyzing unit which obtains a) delay information of a clock path between a first point in a circuit therein and one external clock pin of an external clock pin pair, and delay information of a clock path between a second point in a circuit therein and the other external clock pin of the pair from the inside area circuit delay information, and b) clock skew between the external clock pins of the pair from the clock skew table, and calculates clock skew between the first point and the second point, based on three obtained information to judge, using the calculated clock skew, whether the delay of a clock path or the delay of a signal path of the electronic circuit satisfies timing constraints.

6. The timing analyzing apparatus according to claim 3, comprising:

a global clock distributing unit which is supplied with a top netlist, in which the partial area is defined as a macro and a primitive cell is arranged therein, and distributes a clock to outside and inside of the macro, and makes a post global clock distributing processing top netlist to store in the storage apparatus as the global clock list;

a macro cutting-out unit which cuts out clock paths of the macro from the post global clock distributing processing top netlist to make a post macro cutting-out processing top netlist as the post area cutting-out processing global clock list;

a delay information calculating unit which calculates delay information of the electronic circuit, based on the post global clock distributing processing top netlist; and a layout unit which carries out a circuit layout for the cut-out macro and makes a post layout processing macro netlist to store in the storage apparatus as the post layout processing area netlist.

7. The timing analyzing apparatus according to claim 5, comprising:

a partial area cutting-out unit which cuts out clock paths of the partial area from the chip netlist to make a post arbitrary area cutting-out processing chip netlist as the post area cutting-out processing global clock list; and a layout unit which carries out a circuit layout for the cut-out partial area and makes a post layout processing arbitrary area netlist to store in the storage apparatus as the post layout processing area netlist, wherein the global clock list corresponds to the chip netlist for which processing of arranging a cell and a wiring is carried out inside or outside the partial area of the electronic circuit, and the storage apparatus stores global clock path delay information which indicates information on the delay of the electronic circuit.

8. A timing analyzing apparatus, comprising:

a first means for storing a global clock list including information on clock paths inside and outside a partial area of an electronic circuit, and a post layout processing area netlist which is a netlist of the partial area after layout processing of circuits therein is executed; and a second means for recognizing a clock path between a clock source located outside the partial area and one of two points on the circuits located in the partial area, another clock path located between the clock source and the other point of the two points on the circuits located in the partial area and a common part that exists outside the partial area and is common in the two clock paths; and performing a CRPR calculation between the two points wherein clock delay of the common part is purposefully neglected, to judge whether the delay of a clock path or a signal path of the electronic circuit satisfies timing constraints using the calculated clock skew.

9. The timing analyzing apparatus according to claim 8, wherein the second means includes:

a third means for replacing description on a clock path between a clock tree terminating driver in the post layout processing area netlist and an external clock pin, which is located at a cross point of the periphery of the partial area and a clock path of the electronic circuit, with description in the global clock list on a clock path from the clock source to the clock tree terminating driver, to make an outside area clock path including area netlist;

a fourth means for calculating the delay of the circuit in the partial area, based on the outside area clock path including area netlist to output inside area circuit delay information; and a fifth means for carrying out the CRPR calculation, based on the inside area circuit delay information and the outside area clock path including area netlist, to judge, using the calculated clock skew, whether the delay of a clock path or the delay of a signal path of the electronic circuit satisfies timing constraints.

10. The timing analyzing apparatus according to claim 8, wherein the second means includes:

a sixth means for removing clock paths of the partial area from the global clock list to make a post area cutting-out processing global clock list;

a seventh means for carrying out the CRPR calculation for each pair of external clock pins, each external clock pin being located at a cross point of the periphery thereof and a clock path of the electronic circuit, based on delay information of the electronic circuit and the post area cutting-out processing global clock list, to store the calculated clock skew for each pair in a clock skew table;

a eighth means for calculating the delay of the circuit in the partial area based on the post layout processing area netlist, to output the calculated delay in inside area circuit delay information; and a ninth means for obtaining a) delay information of a clock path between a first point in a circuit therein and one external clock pin of an external clock pin pair, and delay information of a clock path between a second point in a circuit therein and the other external clock pin of the pair from the inside area circuit delay information, and b) clock skew between the external clock pins of the pair from the clock skew table, and calculating clock skew between the first point and the second point, based on three obtained information to judge, using the calculated clock skew, whether the delay of a clock path or the delay of a signal path of the electronic circuit satisfies timing constraints.

11. A timing analyzing method, comprising:

storing a global clock list including information on clock paths inside and outside a partial area of an electronic circuit, and a post layout processing area netlist which is a netlist of the partial area after layout processing of circuits therein is executed;

recognizing using a computer a clock path between a clock source located outside the partial area and one of two points on the circuits located in the partial area, another clock path located between the clock source and the other point of the two points on the circuits located in the partial area and a common part that exists outside the partial area and is common in the two clock paths; and performing using the computer a CRPR calculation between the two points wherein clock delay of the common part is purposefully neglected, to judge whether the delay of a clock path and a signal path of the electronic circuit satisfies timing constraints using the calculated clock skew.

12. The timing analyzing method according to claim 11, wherein the calculating clock skew includes:

replacing description on a clock path between a clock tree terminating driver in the post layout processing area netlist and an external clock pin, which is located at a cross point of the periphery of the partial area and a clock path of the electronic circuit, with description in the global clock list on a clock path from the clock source to the clock tree terminating driver, to make an outside area clock path including area netlist;

calculating the delay of the circuit in the partial area, based on the outside area clock path including area netlist to output inside area circuit delay information; and carrying out the CRPR calculation, based on the inside area circuit delay information and the outside area clock path including area netlist, to judge, using the calculated clock skew, whether the delay of a clock path or the delay of a signal path of the electronic circuit satisfies timing constraints.

13. The timing analyzing method according to claim 11, wherein the calculating clock skew includes:

removing clock paths of the partial area from the global clock list to make a post area cutting-out processing global clock list;

carrying out the CRPR calculation for each pair of external clock pins, each external clock pin being located at a cross point of the periphery thereof and a clock path of the electronic circuit, based on delay information of the electronic circuit and the post area cutting-out processing global clock list, to store the calculated clock skew for each pair in a clock skew table;

calculating the delay of the circuit in the partial area based on the post layout processing area netlist, to output the calculated delay in inside area circuit delay information; and obtaining a) delay information of a clock path between a first point in a circuit therein and one external clock pin of an external clock pin pair, and delay information of a clock path between a second point in a circuit therein and the other external clock pin of the pair from the inside area circuit delay information, and b) clock skew between the external clock pins of the pair from the clock skew table, and calculating clock skew between the first point and the second point, based on three obtained information to judge, using the calculated clock skew, whether the delay of a clock path or the delay of a signal path of the electronic circuit satisfies timing constraints.

14. A non-transitory computer-readable recording medium recording thereon a program which makes a computer function as:

a storage apparatus which stores a global clock list including information on clock paths inside and outside a partial area of an electronic circuit, and a post layout processing area netlist which is a netlist of the partial area after layout processing of circuits therein is executed; and a timing analyzing unit which recognizes a clock path between a clock source located outside the partial area and one of two points on the circuits located in the partial area, another clock path located between the clock source and the other point of the two points on the circuits located in the partial area and a common part that exists outside the partial area and is common in the two clock paths; and performs a CRPR calculation between the two points wherein clock delay of the common part is purposefully neglected, to judge whether the delay of a clock path and a signal path of the electronic circuit satisfies timing constraints using the calculated clock skew.

15. The non-transitory computer-readable recording medium according to claim 14, recording thereon the program which makes a computer function as the timing analyzing unit which includes:

a netlist merging unit which replaces description on a clock path between a clock tree terminating driver in the post layout processing area netlist and an external clock pin, which is located at a cross point of the periphery of the partial area and a clock path of the electronic circuit, with description in the global clock list on a clock path from the clock source to the clock tree terminating driver, to make an outside area clock path including area netlist;

a delay calculating unit which calculates the delay of the circuit in the partial area, based on the outside area clock path including area netlist, to output inside area circuit delay information; and a CRPR base timing analyzing unit which carries out the CRPR calculation, based on the inside area circuit delay information and the outside area clock path including area netlist, to judge, using the calculated clock skew, whether the delay of a clock path or the delay of a signal path of the electronic circuit satisfies timing constraints.

16. The non-transitory computer-readable recording medium according to claim 14, recording thereon the program which makes a computer function as the timing analyzing unit which includes:

a partial area cutting-out unit which removes clock paths of the partial area from the global clock list to make a post area cutting-out processing global clock list;

a clock skew table making unit which carries out the CRPR calculation for each pair of external clock pins, each external clock pin being located at a cross point of the periphery thereof and a clock path of the electronic circuit, based on delay information of the electronic circuit and the post area cutting-out processing global clock list, to store the calculated clock skew for each pair in a clock skew table;

a delay calculating unit which calculates the delay of the circuit in the partial area based on the post layout processing area netlist, to output the calculated delay in inside area circuit delay information; and a CRPR base timing analyzing unit which
obtains
a) delay information of a clock path between a first point in a circuit therein and one external clock pin of an external clock pin pair, and delay information of a clock path between a second point in a circuit therein and the other external clock pin of the pair from the inside area circuit delay information, and b) clock skew between the external clock pins of the pair from the clock skew table, and calculates clock skew between the first point and the second point, based on three obtained information to judge, using the calculated clock skew, whether the delay of a clock path or the delay of a signal path of the electronic circuit satisfies timing constraints.

* * * * *